US009727250B2

(12) United States Patent
Choi et al.

(10) Patent No.: US 9,727,250 B2
(45) Date of Patent: Aug. 8, 2017

(54) NONVOLATILE MEMORY SYSTEM AND OPERATION METHOD OF A MEMORY CONTROLLER THAT MANAGES PAGE SERIAL NUMBERS ACCORDING TO PROGRAM ELAPSED TIMES OF PAGES

(71) Applicant: SAMSUNG ELECTRONICS CO., LTD., Suwon-si, Gyeonggi-Do (KR)

(72) Inventors: In-Hwan Choi, Hwaseong-si (KR); ByungJune Song, Suwon-si (KR); Bomi Kim, Goyang-si (KR)

(73) Assignee: SAMSUNG ELECTRONICS CO., LTD., Sunwon-si, Gyeonggi-Do (KR)

( * ) Notice: Subject to any disclaimer, the term of this patent is extended or adjusted under 35 U.S.C. 154(b) by 226 days.

(21) Appl. No.: 14/579,386

(22) Filed: Dec. 22, 2014

(65) Prior Publication Data
US 2015/0339057 A1    Nov. 26, 2015

(30) Foreign Application Priority Data
May 20, 2014    (KR) .................. 10-2014-0060423

(51) Int. Cl.
*G06F 3/06* (2006.01)
*G11C 8/08* (2006.01)
(Continued)

(52) U.S. Cl.
CPC ................ *G06F 3/061* (2013.01); *G06F 3/06* (2013.01); *G06F 3/0655* (2013.01); *G06F 3/0688* (2013.01); *G11C 8/08* (2013.01); *G11C 16/08* (2013.01); *G11C 29/021* (2013.01); *G11C 29/025* (2013.01); *G11C 29/028* (2013.01); *G11C 2029/1202* (2013.01)

(58) Field of Classification Search
None
See application file for complete search history.

(56) References Cited

U.S. PATENT DOCUMENTS 7,289,348 B2    10/2007 Chen
8,203,885 B2    6/2012 Abiko et al.
(Continued)

FOREIGN PATENT DOCUMENTS

JP        2012-203957    10/2012
KR      1020090117172   11/2009

*Primary Examiner* — Edward Dudek, Jr.
*Assistant Examiner* — Ralph A Verderamo, III
(74) *Attorney, Agent, or Firm* — F. Chau & Associates, LLC

(57) ABSTRACT

A nonvolatile memory system includes a nonvolatile memory device and a memory controller. The nonvolatile memory device includes memory blocks each having a plurality of pages and performs a read operation on the plurality of pages on the basis of read voltages. The memory controller is configured to manage page serial numbers of some of the plurality of pages according to a program elapsed time of each of the plurality of pages. When the memory controller receives a read command and a logical address from an external device, the memory controller is configured to select at least one of the managed page serial numbers, to compare the selected at least one of the page serial numbers with a page serial number of a page corresponding to the received logical address, and to control levels of the read voltages according to a comparison result.

19 Claims, 17 Drawing Sheets

(51) Int. Cl.
*G11C 16/08* (2006.01)
*G11C 29/02* (2006.01)
*G11C 29/12* (2006.01)

(56) References Cited

U.S. PATENT DOCUMENTS

| | | |
|---|---|---|
| 8,467,249 B2 | 6/2013 | Katz et al. |
| 8,599,619 B2 | 12/2013 | Fukuda |
| 2012/0051133 A1 | 3/2012 | Kanda |
| 2012/0069681 A1 | 3/2012 | Oikawa |
| 2012/0102259 A1* | 4/2012 | Goss ........................ G11C 7/04 |
| | | 711/103 |
| 2012/0226850 A1* | 9/2012 | Nakanishi ........... G06F 12/1009 |
| | | 711/102 |
| 2012/0268994 A1 | 10/2012 | Nagashima |
| 2012/0294104 A1 | 11/2012 | Mun et al. |
| 2013/0185612 A1 | 7/2013 | Lee et al. |
| 2013/0238836 A1* | 9/2013 | Suzuki ............... G11C 16/3431 |
| | | 711/103 |
| 2013/0290597 A1* | 10/2013 | Faber ................. G06F 13/1668 |
| | | 711/102 |

\* cited by examiner

FIG. 6

BOT

| BOT Index | Block Number |
|---|---|
| 1 | BLK1 |
| 2 | BLK3 |
| 3 | BLK5 |
| 4 | BLK7 |
| 5 | BLK8 |
| 6 | – |
| 7 | – |
| 8 | – |
| ⋮ | |
| n | – |

FIG. 15

PDT

| Elapsed Time | PDT Index | Read Level Set |
|---|---|---|
| 0.01 ~ 0.5 | IND0 | V11 ~ V71 |
| 0.5 ~ 20 | IND1 | V12 ~ V72 |
| 20 ~ 1000 | IND2 | V13 ~ V73 |
| 1000 ~ | IND3 | V14 ~ V75 |

⋮

NONVOLATILE MEMORY SYSTEM AND OPERATION METHOD OF A MEMORY CONTROLLER THAT MANAGES PAGE SERIAL NUMBERS ACCORDING TO PROGRAM ELAPSED TIMES OF PAGES

CROSS-REFERENCE TO RELATED APPLICATION

This U.S. non-provisional patent application claims priority under 35 U.S.C. §119 to Korean Patent Application No. 10-2014-0060423, filed on May 20, 2014, in the Korean Intellectual Property Office, and the disclosure of which is incorporated by reference herein in its entirety.

TECHNICAL FIELD

The present inventive concept relates to a semiconductor memory, and more particularly, to a nonvolatile memory system and an operation method of a memory controller.

DISCUSSION OF THE RELATED ART

A semiconductor memory device is a memory device embodied using a semiconductor such as silicon Si, germanium Ge, gallium arsenide GaAs, indium phospide InP, etc. A semiconductor memory device is classified into a volatile semiconductor memory device and a nonvolatile semiconductor memory device.

A volatile memory device loses stored data when power supply is interrupted. Examples of the volatile memory device include a static random access memory (RAM) (SRAM), a dynamic RAM (DRAM), a synchronous DRAM (SDRAM), etc. A nonvolatile memory device retains stored data even when power supply is interrupted. Examples of the nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

Since a flash memory operates with high speed and low power consumption, the flash memory may be used in a variety of fields. For example, a mobile system such as a smart phone and a tablet PC uses a large-capacity flash memory.

A flash memory includes semiconductor devices such as a floating gate memory cell, a charge trap flash (CTF) memory cell, etc. The CTF memory cell remembers data by capturing charges in a charge storage layer to change a threshold voltage of the CTF memory cell. However, the CTF memory cell has a characteristic such that as time goes on, charges stored in a charge storage layer move to a channel layer and thereby a threshold voltage of the CTF memory cell is changed. Due to this physical characteristic (referred to as an "IVS (initial verify shift) phenomenon"), data stored in CTF memory cells may be lost.

SUMMARY

According to an exemplary embodiment of the present inventive concept, a nonvolatile memory system is provided. The nonvolatile memory system includes a nonvolatile memory device and a memory controller. The nonvolatile memory device includes a plurality of memory blocks each having a plurality of pages. The nonvolatile memory device is configured to perform a read operation on the plurality of pages on the basis of a plurality of read voltages. The memory controller is configured to manage page serial numbers of some of the plurality of pages according to a program elapsed time of each of the plurality of pages. When the memory controller receives a read command and a logical address from an external device, the memory controller is configured to select at least one of the managed page serial numbers, to compare the selected at least one of the page serial numbers with a page serial number of a page corresponding to the received logical address, and to control levels of the read voltages according to a result of the comparison.

In an exemplary embodiment, each of the page serial numbers may indicate a program order of each of the plurality of pages.

In an exemplary embodiment, the memory controller may be configured to manage the page serial numbers of some of the plurality of pages as a program time stamp table according to the program elapsed time of each of the plurality of pages.

In an exemplary embodiment, the program time stamp table may include a plurality of sub tables. The memory controller may be configured to periodically update the program time stamp table.

In an exemplary embodiment, the program time stamp table may include a plurality of sub tables. Each of the plurality of the sub tables may include the managed page serial numbers and information on the program elapsed time. Each of the information on the program elapsed time of each of the plurality of sub tables may have different periods from each other.

In an exemplary embodiment, the memory controller may be configured to update each of the sub tables at different periods from each other.

In an exemplary embodiment, the memory controller may be configured to manage an assignment order of the plurality of memory blocks.

In an exemplary embodiment, the memory controller may be configured to generate a page serial number of each of the plurality of pages on the basis of the assignment order.

In an exemplary embodiment, the page serial numbers may be sequentially increased according to a program order of each of the plurality of pages.

In an exemplary embodiment, the memory controller may be configured to select the at least one of the managed page serial numbers on the basis of a predefined table. The predefined table may include a plurality of elapsed time periods corresponding to the program elapsed time and index information corresponding to the levels of the read voltages.

In an exemplary embodiment, the memory controller may be configured to compare whether the selected at least one of the page serial numbers are greater than the page serial number of the page corresponding to the received logical address sequentially, and to determine a first elapsed time period of the elapsed time periods based on a result of the comparison In an exemplary embodiment, the memory controller may be configured to control the levels of the read voltages levels of read voltages corresponding to the determined elapsed time period.

In an exemplary embodiment, the nonvolatile memory device may be configured to perform the read operation on the page corresponding to the received logical address on the basis of the controlled read voltages.

According to an exemplary embodiment of the present inventive concept, an operation method of a memory controller is provided. The nonvolatile memory device includes a plurality of pages. The memory controller controls the nonvolatile memory device. The operation method includes receiving a read command and a logical address from an external device, generating a page serial number corresponding to the received logical address, selecting at least one of first page serial numbers being managed, among page serial numbers of the plurality of pages, according to a program elapsed time of each of the plurality of pages on the basis of elapsed time periods of a predefined table, comparing the selected page serial numbers with the page serial number corresponding to the received logical address, and controlling levels of read voltages of the nonvolatile memory device on the basis of a result of the comparison.

In an exemplary embodiment, the comparing the selected at least one of first page serial numbers with the page serial number corresponding to the received logical address may include sequentially comparing whether each of the selected at least one of first page serial numbers is greater than the page serial number corresponding to the received logical address and determining a first elapsed period, of the elapsed time periods, corresponding to the generated page serial number on the basis of the result of comparison.

In an exemplary embodiment, the controlling the levels of the read voltages of the nonvolatile memory device on the basis of the result of the comparison may include controlling the levels of the read voltages to levels of read voltages corresponding to the determined first elapsed period.

According to an exemplary embodiment of the present inventive concept, a nonvolatile memory system is provided. The nonvolatile memory system includes a nonvolatile memory device and a memory controller. The nonvolatile memory device includes a plurality of memory blocks each having a plurality of pages. The nonvolatile memory device is configured to perform a read operation on the plurality of pages on the basis of a plurality of read voltages. The memory controller includes a random access memory (RAM) storing a block order table (BOT), a program time stamp table (PTS), and a predefined table (PDT). The memory controller is configured to manage the block order table according to an assignment order of the plurality of memory blocks, to store page serial numbers of some of the plurality of pages in the program time stamp table according to a program elapsed time of each of the plurality of pages, and to manage the stored page serial numbers. In the case that the memory controller receives a read command and a logical address from an external device, the memory controller is configured to generate a first page serial number of a page corresponding to the received logical address on the basis of the block order table in response to the read command, to select at least one of the page serial numbers stored in the program time stamp table on the basis of the predefined table, to compare the selected page serial numbers with the generated first page serial number, and to control levels of the read voltages according to a result of the comparison.

In an exemplary embodiment, the memory controller may be configured to translate the received logical address into a physical address including a physical block number and a physical page number.

In an exemplary embodiment, the predefine table may include an elapsed time period. The memory controller may be configured to select the at least one of the page serial numbers stored in the program time stamp table on the basis of the elapsed time period.

In an exemplary embodiment, the nonvolatile memory device may perform a read operation on the basis of the controlled read voltages.

BRIEF DESCRIPTION OF THE FIGURES

Exemplary embodiments of the present inventive concept will be described below in more detail with reference to the accompanying drawings. The present inventive concept may, however, be embodied in different forms and should not be constructed as limited to the embodiments set forth herein. Rather, these embodiments are provided so that this disclosure will be thorough and complete, and will fully convey the scope of the present inventive concept to those skilled in the art. Like numbers refer to like elements throughout.

FIGS. 6 and 7 are drawings for explaining a block order table illustrated in FIG. 1 in accordance with an exemplary embodiment of the present inventive concept.

FIGS. 14 and 15 are drawings for explaining a step S150 of FIG. 11 in accordance with an exemplary embodiment of the present inventive concept.

DETAILED DESCRIPTION OF THE EMBODIMENTS

Figure 1:
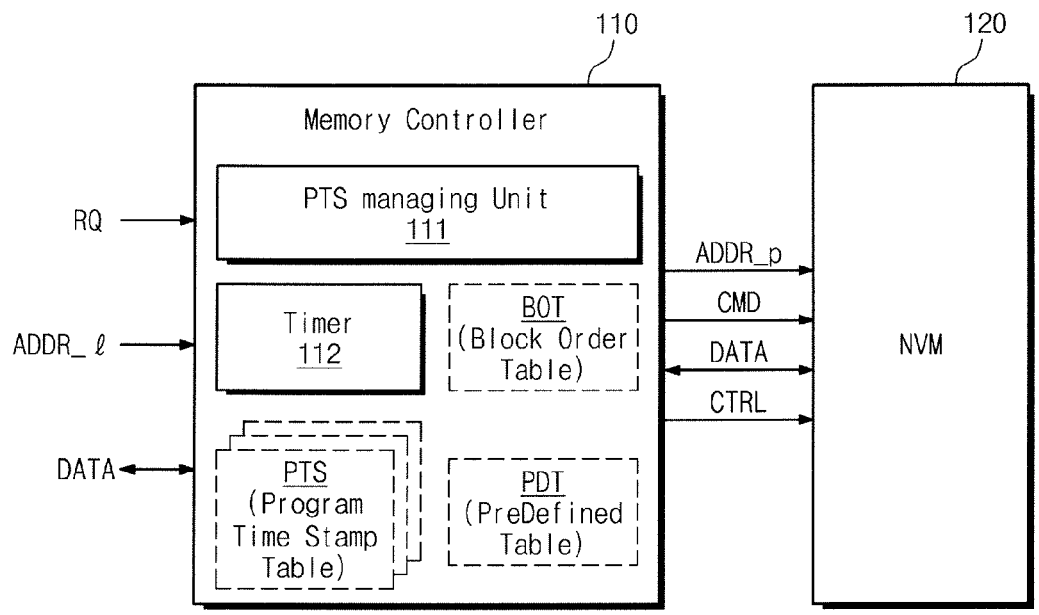
FIG. 1 is a block diagram illustrating a nonvolatile memory system in accordance with an exemplary embodiment of the present inventive concept.

Detailed exemplary embodiments of the present inventive concept are disclosed herein. However, specific structural and functional details disclosed herein are merely representative for purposes of describing exemplary embodiments of the present inventive concept. Exemplary embodiments of the present inventive concept may, however, be embodied in many alternate forms and should not be construed as limited to only the embodiments set forth herein.

Accordingly, while exemplary embodiments of the present inventive concept are capable of various modifications and alternative forms, embodiments thereof are shown by way of example in the drawings and will herein be described in detail. It should be understood, however, that there is no intent to limit exemplary embodiments of the present inventive concept to the particular forms disclosed, but to the contrary, exemplary embodiments of the present inventive concept are to cover all modifications, equivalents, and alternatives falling within the scope of exemplary embodiments of the present inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present inventive concept. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of exemplary embodiments of the present inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a nonvolatile memory system in accordance with an exemplary embodiment of the present inventive concept. Referring to FIG. 1, a nonvolatile memory system 100 includes a memory controller 110 and a nonvolatile memory device 120.

In an exemplary embodiment, each of the memory controller 110 and the nonvolatile memory device 120 may be provided by one chip, one package and one module. The memory controller 110 and the nonvolatile memory device 120 are mounted based on packages such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a thin quad flatpack (TQFP), system in package (SIP), a multi chip package (MCP), a wafer-level fabricated package (WFP), a wafer-level processed stack package (WSP), or the like and may be provided by a nonvolatile memory system such as a memory card.

The memory controller 110 may receive signals such as a request RQ and a logical address ADDR_1 from an external device (for example, an application processor, a host, etc.) and in response to the received signals, the memory controller 110 may transmit data to the external device or write data received from the external device in the nonvolatile memory device 120. The logical address ADDR_1 may indicate a location of data unit defined by the external device.

The memory controller 110 may transmit a command CMD, a physical address ADDR_p and a control signal CTRL to the nonvolatile memory device 120 to write data in the nonvolatile memory device 120 or read out data written in the nonvolatile memory device 120. The memory controller 110 may translate a logical address ADDR_1 received from an external device into a physical address ADDR_P. The physical address ADDR_p indicates physical locations of a plurality of pages included in the nonvolatile memory device 120. In an exemplary embodiment, the physical address ADDR_p may include information such as a physical block number PBN and a physical page number PPN.

The nonvolatile memory device 120 may store the received data or transmit the stored data to the memory controller 110 in response to signals received from the memory controller 110. The nonvolatile memory device 120 may be a NAND flash memory device. The nonvolatile memory device 120 may include a plurality of memory blocks and each memory block may include a plurality of pages. The nonvolatile memory device 120 may also include charge trap flash (CTF) memory cells. However, the present inventive concept is not limited thereto.

The CTF memory cells included in the nonvolatile memory device 120 have a physical characteristic such that threshold voltages of the CTF memory cells are changed as time elapses. The physical characteristic is called an initial verify shift (IVS). Since threshold voltages of the CTF memory cells are changed due to the IVS, read data may include a lot of errors. In the case that the errors are not corrected by an error correction (ECC) circuit (not shown), a separate error correction operation for correcting the errors is required. Since the separate error correction operation may be performed in a software layer, it takes a great deal of error correction time.

In an exemplary embodiment, the memory controller 110 may manage program time of memory cells (or pages) included in the nonvolatile memory device 120.

The memory controller 110 includes a program time stamp table (PTS) managing unit 111, a timer 112, a block order table (BOT), a program time stamp table (PTS), and a predefined table (PDT).

The program time stamp table (PTS) managing unit 111 may manage a program elapsed time of a plurality of pages included in the nonvolatile memory device 120. For example, when data DATA is written in the nonvolatile memory device 120, the PTS managing unit 111 may write a page serial number of a page in which data is written in the PTS and update the PTS at predetermined regular intervals.

The timer 112 may generate a current time by counting a clock (e.g., an operation clock, a reference clock, etc.). In an exemplary embodiment, the clock may be received from an external device. Alternatively, the clock may be generated from the inside of the memory controller 110. In an exemplary embodiment, the current time may be an absolute time. Alternatively, the current time may be a relative time with respect to a reference time.

The BOT may include assignment order information on a plurality of memory blocks included in the nonvolatile memory device 120. For example, the memory controller 110 may translate a logical address ADDR_1 received from an external device into a physical address ADDR_p of the nonvolatile memory device 120. At this time, the memory controller 110 may sequentially assign the memory blocks of the nonvolatile memory device 120. The BOT may include the assignment order information on the memory blocks. The PTS managing unit 1111 may generate a page serial number (PSN) on the basis of the BOT. The BOT and the page serial number will be described in further detail with reference to FIGS. 6 and 7.

The PTS may include program elapsed time information on the pages included in the nonvolatile memory device 120. The PTS may be managed in a log-scale. The PTS managing unit 111 may manage the program elapsed time information on the pages on the basis of the PTS. The PTS will be described in further detail with reference to FIGS. 8 through 10.

The predefined table (PDT) includes program elapsed time and index information. For example, the PDT includes program elapsed time period and index information. The program elapsed time period indicates a range of the program elapsed time. The PDT index information indicates information of a read voltage set. For example, a first elapsed time period may indicate 0 s~0.5 s. A second elapsed time period may indicate 0.5 s~20 s. In this case, the PDT index information with respect to the first elapsed time period may be "1". The PDT index information with respect to the second elapsed time period may be "2". In the case that a program elapsed time of a selected page (e.g., a page to be read) is included in the first elapsed time period, the memory controller 110 may control so that the nonvolatile memory device 120 performs a read operation on the basis of a read voltage set corresponding to the PDT index information "1".

To determine PDT index information corresponding to a page in which a read operation will be performed, the PTS managing unit 111 selects some of page serial numbers included in the PTS on the basis of the program elapsed time period included in the PDT without scanning the whole PTS, and compares the selected page serial number with a serial number of the page to be read, and determines index information corresponding to the page to be read according to a comparison result.

According to an exemplary embodiment of the present inventive concept, when searching PDT index information to control a read voltage of the nonvolatile memory device 120, without sequentially searching the PTS, the memory controller 110 may search some of the PTS on the basis of the PDT to determine index information. Thus, since a read latency is reduced, a nonvolatile memory system having increased performance is provided.

Figure 2:
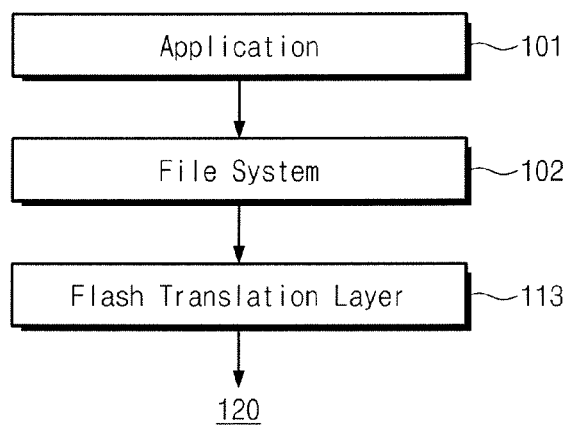
FIG. 2 is a block diagram illustrating a software layer of the nonvolatile memory system illustrated in FIG. 1 in accordance with an exemplary embodiment of the present inventive concept.

FIG. 2 is a block diagram illustrating a software layer of the nonvolatile memory system illustrated in FIG. 1 in accordance with an exemplary embodiment of the present inventive concept. Referring to FIGS. 1 and 2, an application 101 indicates various application programs being driven in an external device. Data generated by a drive of the application 101 or data needed to drive the application 101 may be stored in the nonvolatile memory device 120.

In the case that a file or data is stored in the nonvolatile memory device 120, the file system 102 organizes the file or the data. For example, the file system 102 may provide a logical address ADDR_1 to the memory controller 110. The file system 102 may have a different form depending on an operating system (OS) of an external device. The file system 102 may include a FAT (file allocation table), a FAT32, a NTFS (NT file system), a HFS (hierarchical file system), a JFS2 (journaled file system2), an XFS, an ODS-5 (on-disk structure-5), a UDF, a ZFS, a UFS (unix file system), an ext2, an ext3, an ext4, a reiserFS, a reise4, an ISO 9660, a Gnmoe VFS, a BFS, or a WinFS, etc. The application 101 and the file system 102 may be driven by an external device (for example, a host, an AP, etc.).

A flash translation layer (FTL) 113 may provide an interface between an external device and the nonvolatile memory device 120 so that the nonvolatile memory device 120 is effectively used. The FTL 113 may assign a plurality of memory blocks included in the nonvolatile memory device 120 as a write block and manage them. For example, the FTL 113 may receive a logical address ADDR_1 generated by the file system 102 and translate the received logical address ADDR_1 into a physical address ADDR_p that is available in the nonvolatile memory device 120. The FTL 113 judges whether a write-enable page exists in a memory block assigned as the write block. In the case that a write-enable page does not exist in the assigned write memory block, the FTL 113 may assign a new free block as a write block. Thus, the FTL 113 sequentially assigns a write block. The FTL 113 may manage an address translation through a mapping table. The FTL 113 may be driven by the memory controller 110.

The FTL 113 may perform an operation such as a garbage collection, a wear-leveling, etc. The FTL 113 may generate a free block or assign a write block on the basis of a garbage collection, a wear leveling, etc.

Figure 3:
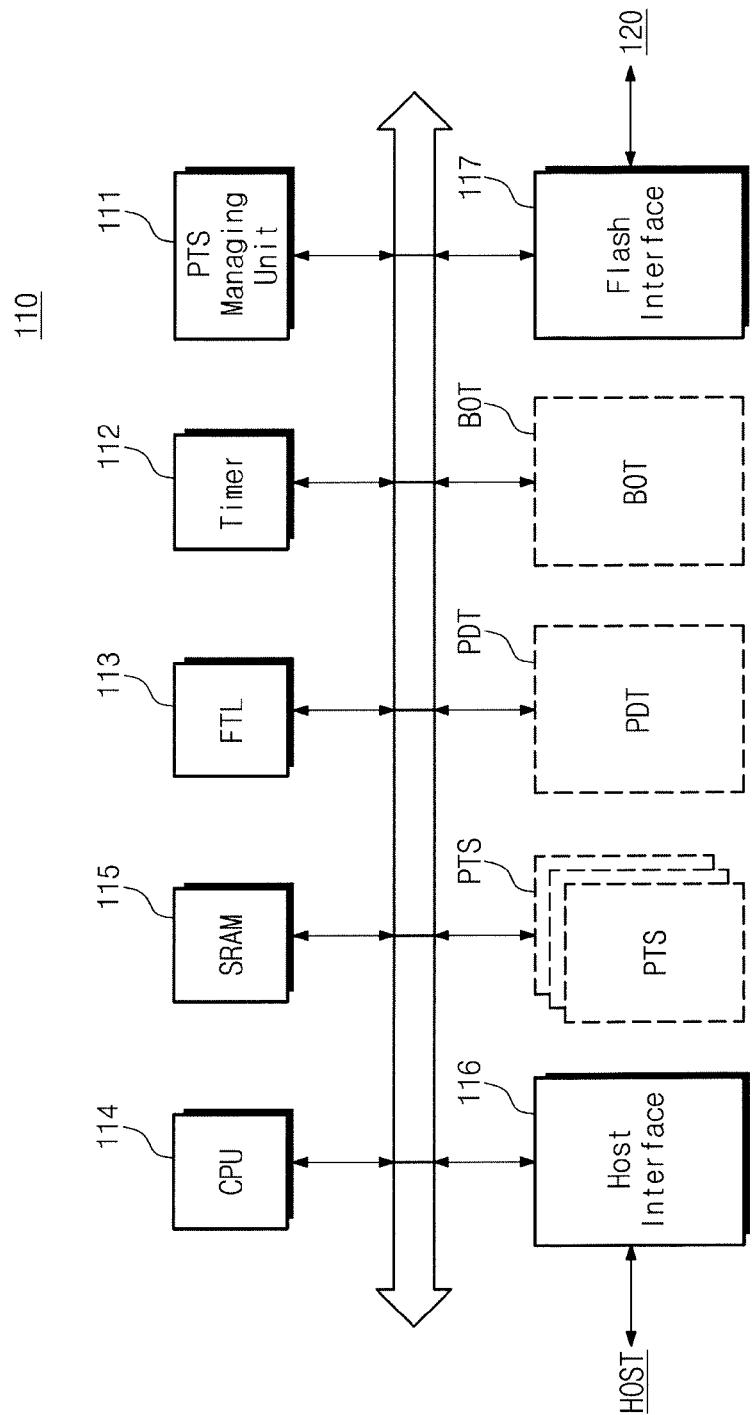
FIG. 3 is a block diagram illustrating a memory controller illustrated in FIG. 1 in accordance with an exemplary embodiment of the present inventive concept.

FIG. 3 is a block diagram illustrating a memory controller illustrated in FIG. 1 in accordance with an exemplary embodiment of the present inventive concept. The memory controller 110 includes a PTS managing unit 111, a timer 112, an FTL 113, a CPU 114, an SRAM 115, a host interface 116, a flash interface 117, a BOT, a PTS, a PDT, or the like.

Since the PTS managing unit 111, the timer 112, the FTL 113, the BOT, the PTS, and the PDT were described with reference to FIG. 1, a detailed description thereof will be omitted.

The CPU 114 may control an overall operation of the memory controller 110. The SRAM 115 may operate as a buffer memory, an operation memory, and a main memory of the memory controller 110.

The memory controller 110 may communicate with an external device (for example, a host, an application processor, etc.) through the host interface 116. The host interface 116 may be provided by at least one of various interfaces such as a universal serial bus (USB), a multimedia card (MMC), a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), a mobile industry processor interface (MIPI), a nonvolatile memory-express (NVMe), a universal flash storage (UFS) interface, etc. The memory controller 110 may communicate with the nonvolatile memory device 120 through the flash interface 117.

The PTS managing unit 111 and the FTL 113 may be embodied by a software layer and may be driven by the CPU 114. The PTS managing unit 111 and the FTL 113 may be stored in a separate storage medium (for example, a ROM, or a meta area of the nonvolatile memory device 120) in a firmware form and may be driven by the CPU 114. The BOT, the PTS, and the PDT may be stored in the SRAM 115 and may be updated by the CPU 114 driving the PTS managing unit 111 and the FTL 113. The BOT, the PTS, and the PDT stored in the SRAM 115 may be flushed to the meta area of the nonvolatile memory device 120.

Figure 4:
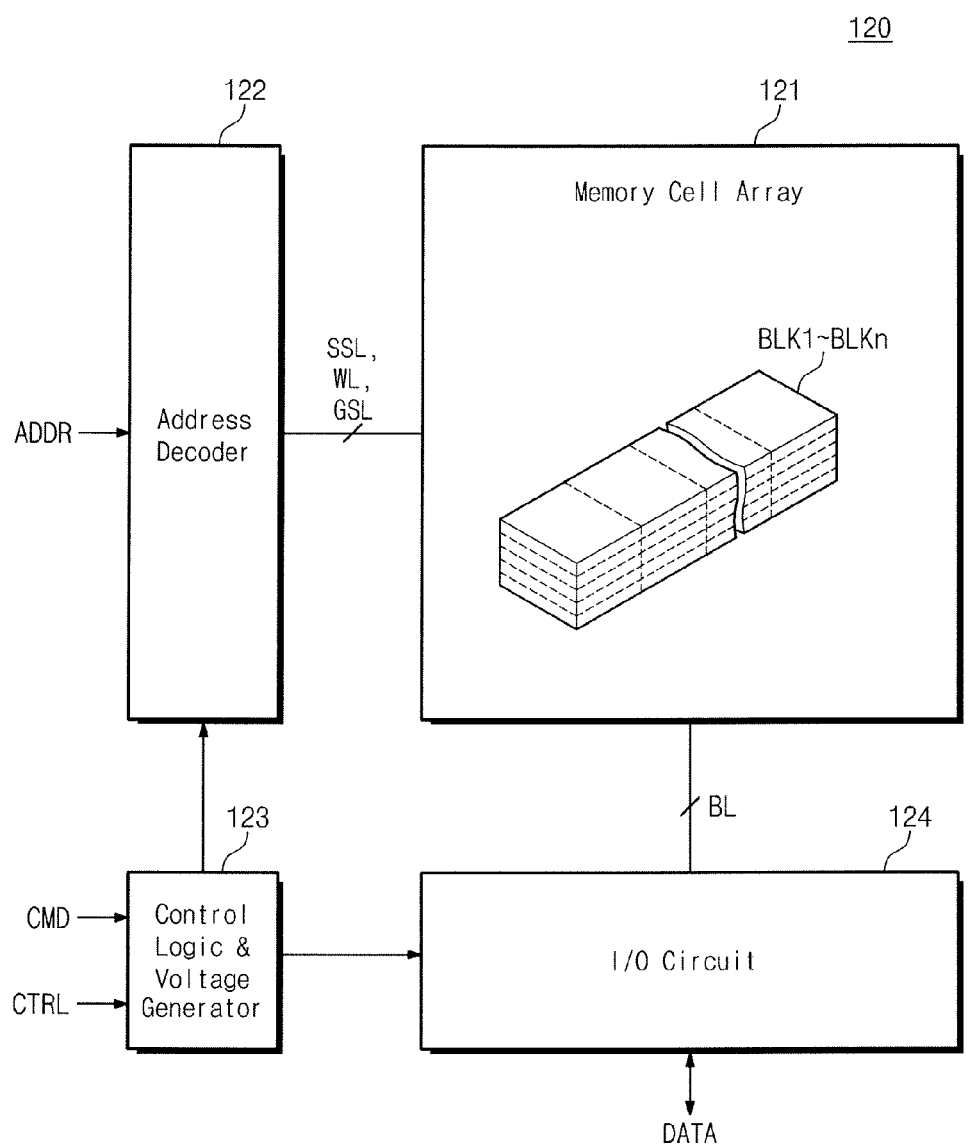
FIG. 4 is a block diagram illustrating a nonvolatile memory device illustrated in FIG. 1 in accordance with an exemplary embodiment of the present inventive concept.

FIG. 4 is a block diagram illustrating a nonvolatile memory device illustrated in FIG. 1 in accordance with an exemplary embodiment of the present inventive concept. Referring to FIGS. 1 and 4, the nonvolatile memory device 120 includes a memory cell array 121, an address decoder 122, a control logic and voltage generator 123, and an input/output circuit 124.

The memory cell array 121 includes a plurality of memory blocks BLK1~BLKn. Each of the plurality of memory blocks BLK1~BLKn includes a plurality of cell strings. Each of a plurality of cell strings includes a plurality of memory cells. The memory cells are connected to a plurality of word lines, respectively. Each memory cell may be operated as a single level cell (SLC) storing one bit or a multi-level cell (MLC) storing at least two bits.

Each of the memory blocks BLK1~BLKn may have a three-dimensional structure stacked in a direction perpendicular to a substrate (not shown). The three-dimensional structure of the memory blocks will be described in detail with reference to FIG. 5.

Some of the memory blocks BLK1~BLKn included in the memory cell array 121 are used as a meta area and the BOT, the PTS, and the PDT described with reference to FIG. 1 may be stored in the meta area.

The address decoder 122 is connected to the memory cell array 121 through a plurality of word lines WL, string select lines SSL, and ground select lines GSL. The address decoder 122 may receive a physical address ADDR-p from the memory controller 110 and decode the received physical address ADDR_p to drive the plurality of word lines WL. For example, the physical address ADDR_p may include a physical block number and a physical page number. The address decoder 122 may select a memory block corresponding to the physical block number included in the physical address ADDR_p and select a page corresponding to the physical page number included in the physical address ADDR_p among a plurality of pages included the selected memory block. The address decoder 122 may control voltage of the each word line WL to perform a read or write operation with respect to the selected page.

The control logic & voltage generator 123 may receive a command CMD and a control signal CTRL from the memory controller 110. The control logic & voltage generator 123 may control the address decoder 122 and the input/output circuit 124 in response to the received signals. For example, the control logic & voltage generator 123 may control the address decoder 122 and the input/output circuit 124 in response to the command CMD and the control signal CTRL so that data is written in the memory cell array 121. The control logic & voltage generator 123 may control the address decoder 122 and the input/output circuit 124 in response to the command CMD and the control signal CTRL so that data stored in the memory cell array 121 is read out. The control logic & voltage generator 123 may control the address decoder 122 and the input/output circuit 124 in response to the command CMD and the control signal CTRL so that some of the memory cell arrays 121 are erased.

The control logic & voltage generator 123 may generate various voltages being required for operations of the nonvolatile memory device 120 operates. For example, the control logic & voltage generator 123 may generate various voltages such as a plurality of select read voltages, a plurality of unselect read voltages, a plurality of program voltages, a plurality of pass voltages, and a plurality of erase voltages to provide the generated voltages to the address decoder 122 or the memory cell array 121.

The control logic & voltage generator 123 may control levels of a plurality of select read voltages under a control of the memory controller 110. For example, the control logic & voltage generator 123 may generate any one of the select read voltage sets under the control of the memory controller 110. The address decoder 122 may supply the generated select read voltage set to a selected word line among the plurality of word lines WL.

The input/output circuit 124 is connected to the memory cell array 121 through a plurality of bit lines BL. The input/output circuit 124 may control the bit lines BL so that data received from the memory controller 110 is written in the memory cell array 121. The input/output circuit 124 may control the bit lines BL so that data written in the memory cell array 121 is read out. The input/output circuit 124 may be configured to perform a copy-back operation.

The input/output circuit 124 may include constituent elements such as a page buffer (or a page register), a column select circuit, a data buffer, a global buffer, etc. The input/output circuit 124 may include constituent elements such as a sense amplifier, a write driver, a column select circuit, a data buffer, etc.

Figure 5:
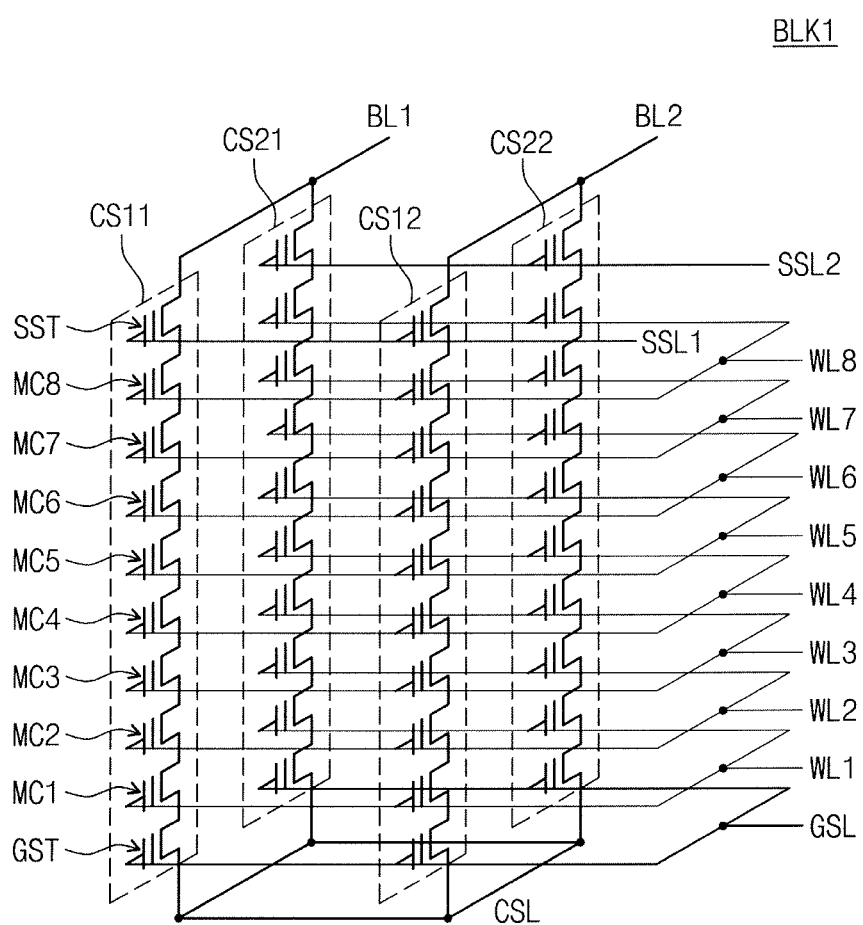
FIG. 5 is a circuit diagram illustrating a first memory block among a plurality of memory blocks illustrated in FIG. 4 in accordance with an exemplary embodiment of the present inventive concept.

FIG. 5 is a circuit diagram illustrating a first memory block among a plurality of memory blocks illustrated in FIG. 4 in accordance with an exemplary embodiment of the present inventive concept. A first memory block BLK1 is described with reference to FIG. 5 in an exemplary embodiment, however the present inventive concept is not limited thereto. The remaining memory blocks BLK2~BLKn may have substantially the same structure as the first memory block BLK1.

Referring to FIGS. 4 and 5, the first memory block BLK1 includes a plurality of cell strings CS11, CS12, CS21 and CS22. The cell strings CS11, CS12, CS21, and CS22 are arranged along a row direction and a column direction to form rows and columns.

Each of the cell strings CS11, CS12, CS21, and CS22 may include a plurality of cell transistors. The cell transistors includes a string select transistor SST, a plurality of memory cells MC1~MC8, and a ground select transistor GST. The string select transistor SST is connected to a string select line SSL. The string select line SSL may be divided into first and second string select lines SSL1 and SSL2. The memory cells MC1~MC8 are connected to word lines WL1~WL8, respectively. Word lines having the same height are connected in common. The ground select transistor GST is connected to a ground select line GSL. Each cell string is connected between a bit line BL and a common source line CSL. For example, the string select transistor SST is connected to the bit line BL and the ground select transistor GST is connected to the common source line CSL.

Cell strings disposed in the same column are connected to the same bit line. For example, the cell strings CS11 and CS21 are connected to a first bit line BL1. The cell strings CS12 and CS22 are connected to a second bit line BL2.

Cell strings disposed in the same row are connected to the same string select line. For example, the cell strings CS11 and CS12 are connected to the first string select line SSL1. The cell strings CS21 and CS22 are connected to the second string select line SSL2.

Each of the cell strings CS11, CS12, CS21 and CS22 is stacked in a direction perpendicular to a substrate (not shown). For example, the ground select transistor GST, the memory cells MC1~MC8 and the string select transistor SST may be stacked in the direction perpendicular to the substrate to be formed. In an exemplary embodiment, the memory cells MC1~MC8 may be constituted by charge trap flash (CTF) memory cells.

The first memory block BLK1 illustrated in FIG. 5 is illustrative, but, the present inventive concept is not limited thereto. For example, the number of rows of cell strings may be increased or reduced. As the number of rows of cell strings is changed, the number of string select lines or ground select lines connected to rows of the cell strings and the number of cell strings connected to one bit line may also be changed.

The number of columns of cell strings may be increased or reduced. As the number of columns of cell strings is changed, the number of bit lines connected to columns of the cell strings and the number of cell strings connected to one string select line may also be changed.

A height of cell strings may be increased or reduced. For example, the number of memory cells being stacked in each cell string may be increased or reduced. As the number of memory cells being stacked in each cell string is changed, the number of word lines may also be changed.

The number of string select transistors or ground select transistors being provided to each cell string may be increased. For example, as the number of string select transistors or ground select transistors being provided to each cell string is changed, the number of string select lines or ground select lines may also be changed. In the case that the number of string select lines or ground select lines is increased, the string select lines or the ground select lines may be stacked in the same form as the memory cells MC1~MC8.

In an exemplary embodiment, write and read operations may be performed by a row unit of the cell strings CS11, CS12, CS21, and CS22. The cell strings CS11, CS12, CS21, and CS22 may be selected by one row unit by the string select lines SSL1 and SSL2.

In a selected row of the cell strings CS11, CS12, CS21, and CS22, write and read operations may be performed by a page unit. The page may be one row of memory cells connected to one word line. Alternatively, the page may be a unit of data stored in one row of memory cells connected to one word line. In a selected row of the cell strings CS11, CS12, CS21, and CS22, memory cells may be selected by a page unit by the word lines WL1~WL8.

Figure 7:
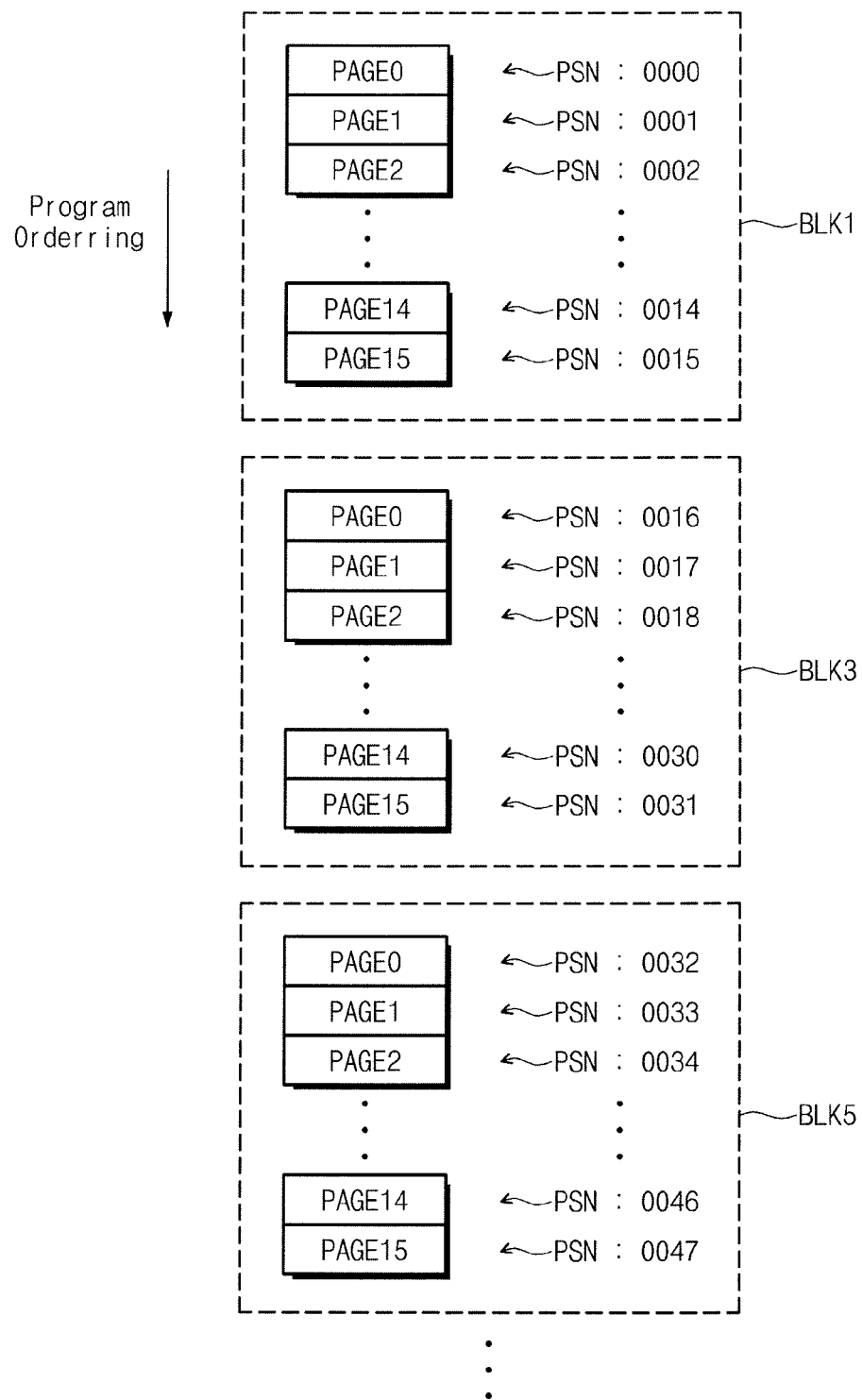

FIGS. 6 and 7 are drawings for explaining a block order table (BOT) illustrated in FIG. 1 in accordance with an exemplary embodiment of the present inventive concept. Referring to FIGS. 1 and 6, the BOT includes block assign order information. For example, the memory controller 110 may sequentially assign a plurality of memory blocks BLK1~BLKn. The memory controller 110 may assign a memory block considering wear leveling of each of memory blocks BLK1~BLKn. The memory controller 110 stores assign order information on the memory blocks BLK1~BLKn in the BOT. Referring to the BOT illustrated in FIG. 6, after assigning the first memory block BLK1, the memory controller 110 sequentially assigns the third memory block BLK3, the fifth memory block BLK5, the seventh memory block BLK7, and the eighth memory block BLK8.

In addition, in the case that all pages of the eighth memory block BLK8 are programmed (e.g., in the case that an available page does not exist in the eighth memory block BLK8), the memory controller 110 may assign any one of the memory blocks considering wear leveling of each of the memory blocks and stores information on the assigned memory block in the BOT as a value corresponding to a BOT index '6'.

The BOT index included in the BOT indicates an assignment order of the memory blocks. In an exemplary embodiment, a size of the BOT index may be the same as the number of the memory blocks. In an exemplary embodiment, a size of the BOT index may be the same as the number of memory blocks except a reserved block among the memory blocks.

Referring to FIGS. 1, 6, and 7, the memory controller 110 may generate a page serial number of each page on the basis of the BOT. For example, as illustrated in FIG. 6, the memory controller 110 may assign the first memory block BLK1 as a write block. The memory controller 110 may sequentially write data in a plurality of pages PAGE0~PAGE15 included in the first memory block BLK1.

A zeroth page PAGE0 of the first memory block BLK1 may have a page serial number of "0000". A first page PAGE1 of the first memory block BLK1 may have a page serial number of "0001". A second page PAGE2 of the first memory block BLK1 may have a page serial number of "0002".

Similarly, fourteenth and fifteenth pages PAGE14 and PAGE15 of the first memory block BLK1 may have page serial numbers of "0014" and "0015", respectively. As described above, the memory controller 110 sequentially write data to the pages PAGE0~PAGE15 included in the first memory block BLK1. The page serial numbers may be assigned to each page according to the order (e.g., program order) in which the data is written.

In addition, in the case that data is written in all the pages PAGE0~PAGE15 included in the first memory block BLK1 or a write enable page does not exist in the pages PAGE0~PAGE15, the memory controller 110 may assign the third memory block BLK3 as a write block. The memory controller 110 may sequentially write data in a plurality of pages PAGE0~PAGE15 included in the third memory block BLK3 and assign a page serial number to each of the pages PAGE0~PAGE15 of the third memory block BLK3 according to the order in which the data is written. In an exemplary embodiment, the page serial numbers of the pages included in the third memory block BLK3 may be consecutive to the page serial number of the pages included in the first memory block BLK1 (for example, a memory block previously assigned as a write block).

Likely, the memory controller 110 assigns the fifth memory block BLK5 as a write block and sequentially writes data in a plurality of pages PAGE0~PAGE15 of the fifth memory block BLK5. The memory controller 110 may assign a page serial number of each the pages PAGE0~PAGE15 of the fifth memory block BLK5 according to the order in which the data is written.

As described above, the memory controller 110 may manage the page serial numbers of pages on the basis of the assigned order of the memory block, and the page serial numbers may be determined based on the order in which data is written in the pages. For example, the page serial number may sequentially increase according to the program order of the pages.

For brevity of description, the first, third, and fifth memory blocks BLK1, BLK3, and BLK5 were described in an exemplary embodiment of the present inventive concept but, the present inventive concept is not limited thereto. Each of the first, third, and fifth memory blocks BLK1, BLK3, and BLK5 was described to include zeroth through fifteenth pages PAGE0~PAGE15 with reference to FIG. 7 in an exemplary embodiment of the present inventive concept, but the present inventive concept is not limited thereto. Memory blocks may further include a plurality of pages. Reference numerals and numeral values of FIGS. 6 and 7 are illustrative and the present inventive concept is not limited thereto.

Figure 8:
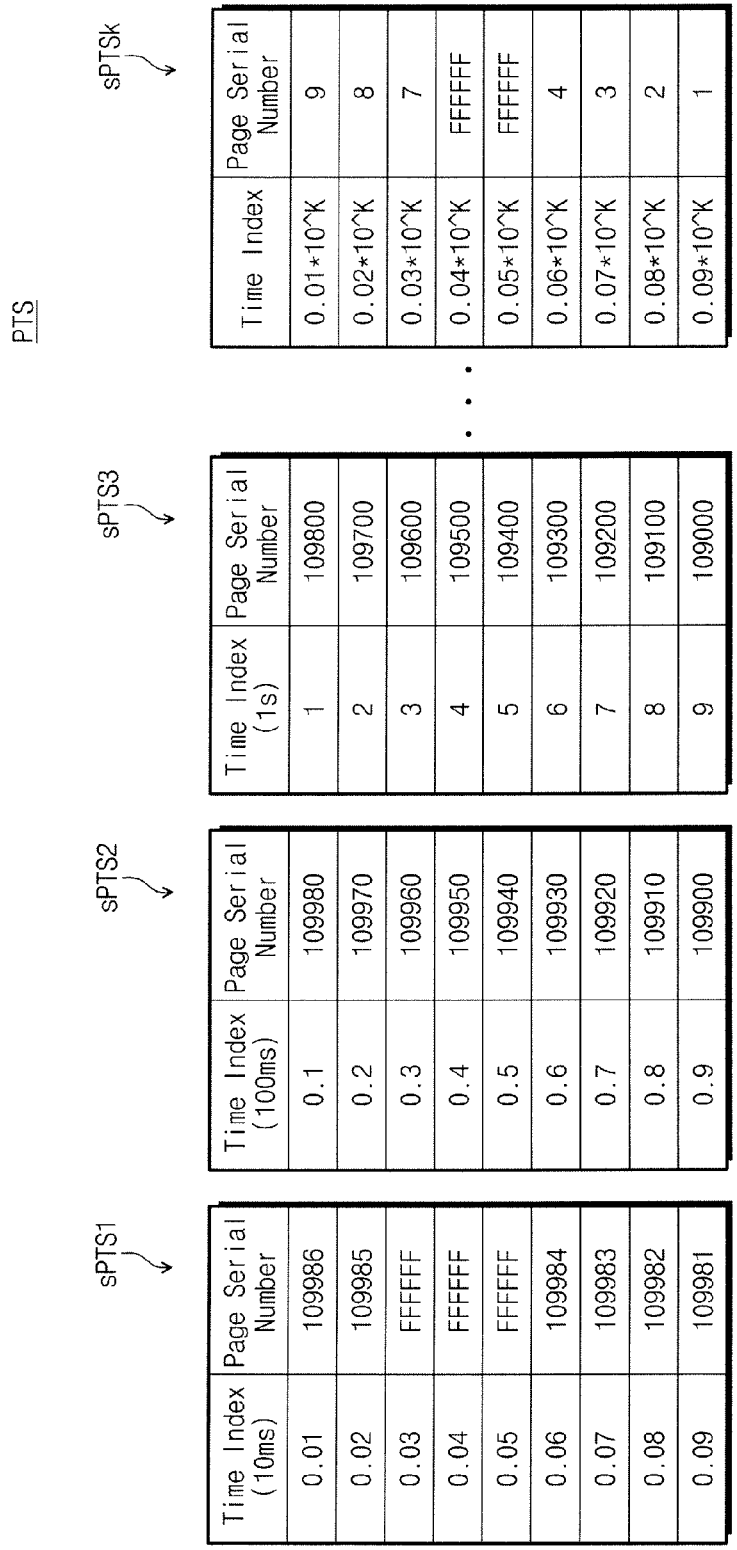
FIGS. 8 through 10 are drawings for explaining a program time stamp table illustrated in FIG. 1 in accordance with an exemplary embodiment of the present inventive concept.
Figure 9:
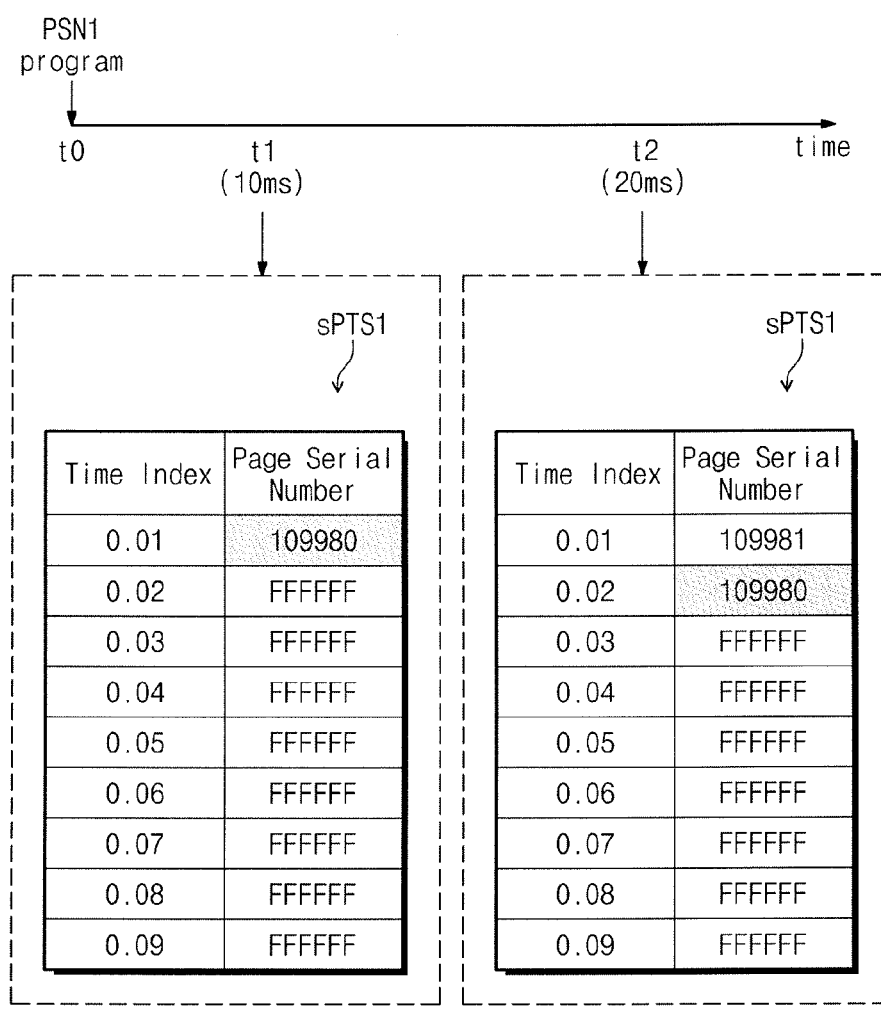
Figure 10:
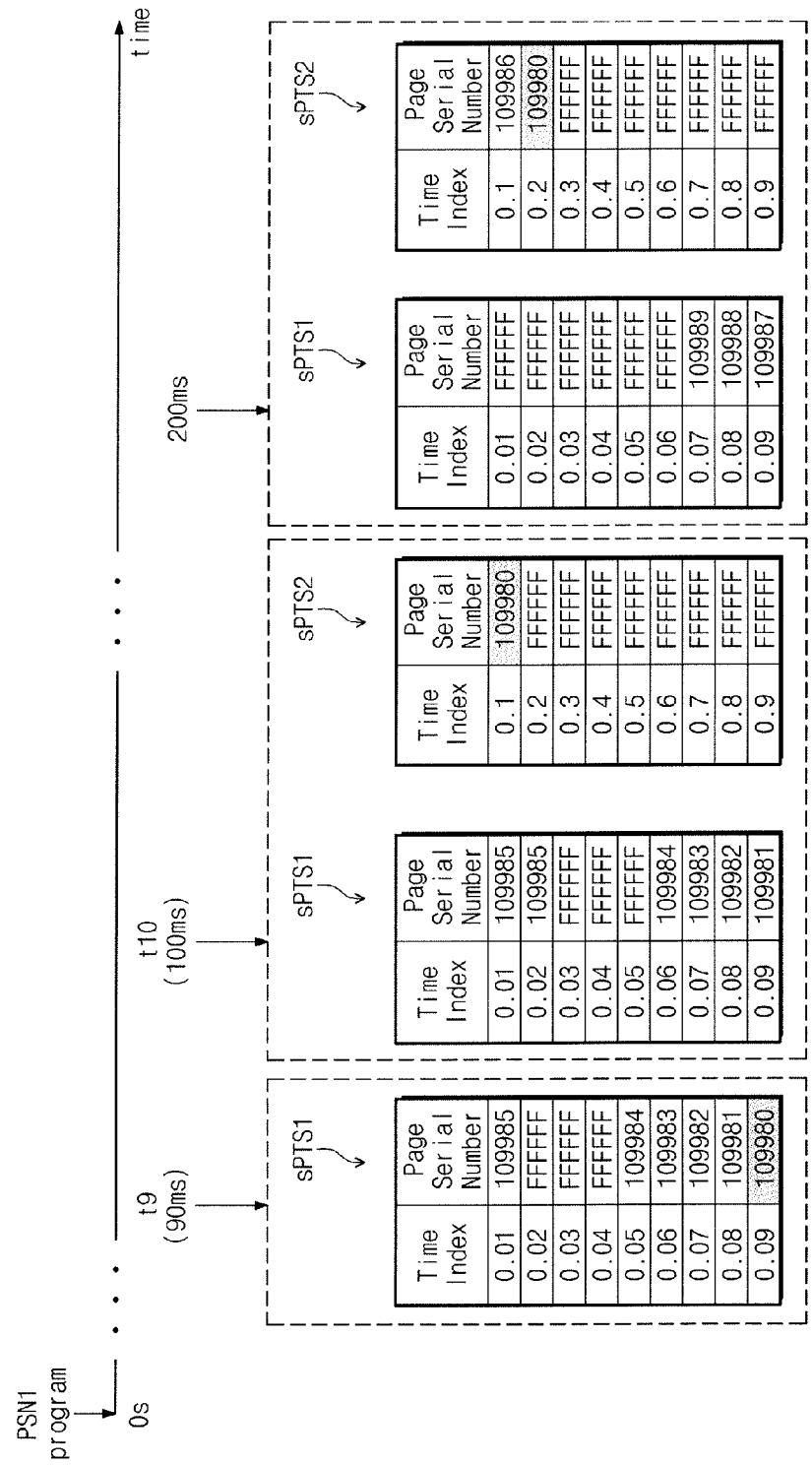

FIGS. 8 through 10 are drawings for explaining a program time stamp table (PTS) illustrated in FIG. 1 in accordance with an exemplary embodiment of the present inventive concept. Referring to FIG. 1 and FIGS. 8 through 10, the memory controller 110 may manage the PTS. The PTS includes a plurality of sub program time stamp tables sPTS1~sPTSk (hereinafter, it is referred to as 'sub table'). Each of the sub tables sPTS1~sPTSk includes time index information and information on page serial numbers. The time index information may indicate information on a program elapsed time or a period of program elapsed time.

A time index of each of the sub tables sPTS1~sPTSk may be managed by different units. For example, a time index of the first sub table sPTS1 is managed by a 10 ms (millisecond) unit. For example, the first sub table sPTS1 may be updated at every 10 ms. A time index of the second sub table sPTS2 is managed by a 100 ms unit. The second sub table sPTS2 may be updated at every 100 ms. A time index of the third sub table sPTS3 is managed by a 1 s (second) unit. The third sub table sPTS3 may be updated at every 1 s. For example, the sub tables sPTS1~sPTSk may be managed by a log scale.

As illustrated in FIG. 9, at a zeroth time t0, data may be written in a page corresponding to the first page serial number PSN1. For brevity of description, it will be assumed that the first page serial number PSN1 have a value "109980". The memory controller 110 may update the first sub table sPTS1 at a first time t1 (e.g., a time when 10 ms has elapsed from the zeroth time t0). For example, at a first time t1, the first page serial number PSN1 is written in the first sub table sPTS1 so that the first page serial number PSN1 corresponds to the first time index '0.01'.

In addition, at a second time t2 (e.g., a time when 20 ms has elapsed from the zeroth time t0), the memory controller 110 may update the first sub table sPTS1. For example, at a second time t2, the first page serial number PSN1 written in the first time index '0.01' moves to a second time index '0.02' and a page serial number having a value '109981' is written in the first time index '0.01'. The page serial number of "109981" may be a page serial number corresponding to any one of pages written in a period between the first time t1 and the second time t2.

As illustrated in FIG. 10, the memory controller 110 may update the first sub table sPTS1 at every 10 ms until a ninth time t9 (e.g., a time when 90 ms has elapsed from the zeroth time t0).

At a tenth time t10 (e.g., time when 100 ms has elapsed from the zeroth time t0), the memory controller 110 may update the first and second sub tables sPTS1 and sPTS2. For example, the first page serial number "109980" is deleted in the first sub table sPTS1 and may be written in a first time index '0.1' of the second sub table sPTS2. A time index of the second sub table sPTS2 may be managed by 100 ms unit.

In addition, at a twentieth time t20 (e.g., a time when 200 ms has elapsed from the zeroth time t0), the memory controller 110 may update the first and second sub tables sPTS1 and sPTS2. For example, the second sub table sPTS2 may be update at every 100 ms.

As described above, the memory controller 110 may manage a program elapsed time and a page serial number at every 10 ms on the basis of the first sub table sPTS1 and may manage a program elapsed time and a page serial number at every 100 ms on the basis of the second sub table sPTS2. For example, the memory controller 110 may manage a program elapsed time of a plurality of pages on the basis of a plurality of sub tables sPTS1~sPTSk having different management units of time index from one another.

Reference numerals (for example, a page serial number, a time index of a plurality of sub tables sPTS1~sPTSk) described with reference to FIGS. 8 through 10 are illustrative and the present inventive concept is not limited thereto. A time index management unit of the sub tables sPTS1~sPTSk may be variously changed. The page serial numbers may be sequentially increased. In an exemplary embodiment, the page serial numbers might not be sequentially increased.

Figure 11:
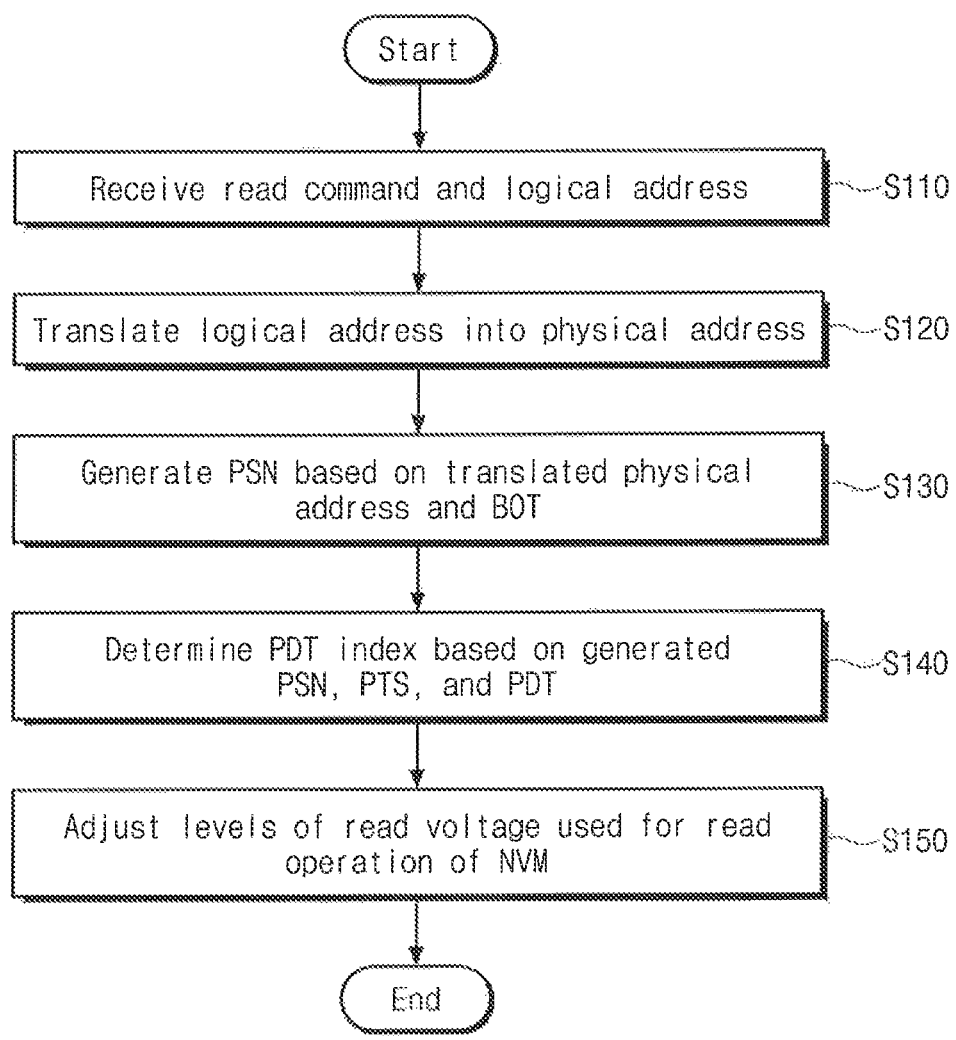
FIG. 11 is a flow chart illustrating an operation of a memory controller illustrated in FIG. 1 in accordance with an exemplary embodiment of the present inventive concept.

FIG. 11 is a flow chart illustrating an operation of a memory controller illustrated in FIG. 1 in accordance with an exemplary embodiment of the present inventive concept. Referring to FIGS. 1 and 11, in a step S110, the memory controller 110 may receive a read command RQ and a logical address ADDR_1 from an external device. The logical address ADDR_1 may indicate a logical location of data being managed by the external device.

In a step S120, the memory controller 110 may translate the received logical address ADDR_1 into a physical address ADDR_p. The physical address ADDR_p may indicate a physical location in the nonvolatile memory device 120. In an exemplary embodiment, the step S120 may be performed by the FTL 113 included in the memory controller 110. In an exemplary embodiment, the step S120 may be performed by the CPU 114 (refer to FIG. 2) for driving the FTL 113.

In a step 130, the memory controller 110 may generate a page serial number on the basis of the translated physical address ADDR_p and a BOT. For example, the BOT include a BOT index indicating assignment order of memory blocks. The physical address ADDR_p includes information of a physical block number and a physical page number. The memory controller 110 may search a BOT index (for example, assignment order) of a memory block corresponding to the physical block number in the BOT on the basis of the physical block number included in the physical address ADDR_p. The memory controller 110 may generate the page serial number on the basis of the searched BOT index and the physical page number. An operation of the step S130 will be described in detail with reference to FIG. 12.

In a step S140, the memory controller 110 may determine a PDT index on the basis of the generated page serial number, a PTS, and a PDT. For example, the memory controller 110 may sample some of the page serial numbers included in the PTS on the basis of information on elapsed time period (e.g., PDT index) included in the PDT. The memory controller 110 may compare the sampled page serial numbers with the generated page serial number to determine a PDT index. An operation of the step S140 will be described in detail with reference to FIG. 14.

In a step S150, the memory controller 110 may control levels of a plurality of voltages of the nonvolatile memory device 120 on the basis of the determined PDT index. An operation of the step S150 will be described in detail with reference to FIG. 14.

In an exemplary embodiment, the nonvolatile memory device 120 may perform a read operation on the basis of a read voltage set controlled by the memory controller 110.

Figure 12:
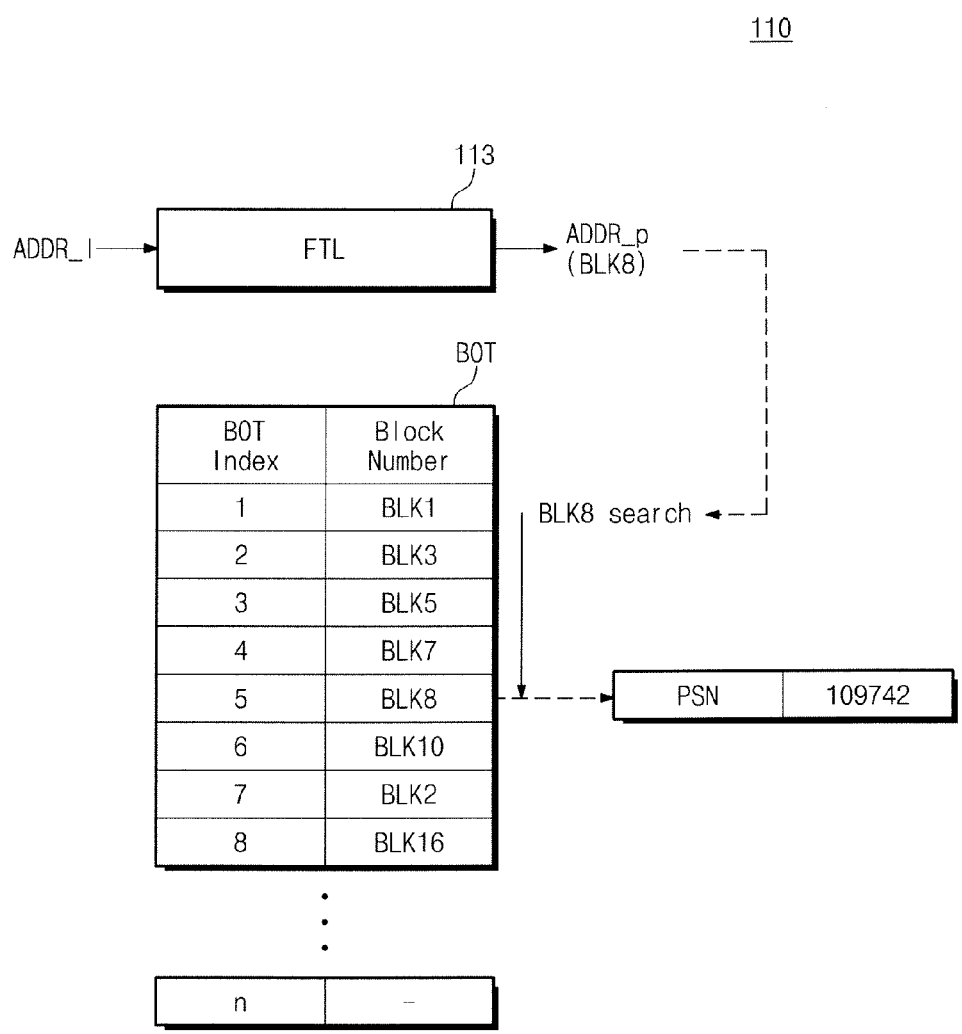
FIG. 12 is a drawing for explaining a step S130 of FIG. 11 in accordance with an exemplary embodiment of the present inventive concept.

FIG. 12 is a drawing for explaining a step S130 of FIG. 11. Referring to FIGS. 1, 2, and 12, the memory controller 110 may receive a logical address ADDR_1 from an external device. The memory controller 110 may translate the received logical address ADDR_1 into a physical address ADDR_p. For example, the FTL 113 included in the memory controller 110 may translate the received logical address ADDR_1 into the physical address ADDR_p.

The translated physical address ADDR_p may include a physical block number and a physical page number. For brevity of description, it will be assumed that the physical address ADDR_p includes a physical block number of an eighth memory block BLK8. However, the present inventive concept is not limited thereto.

The memory controller 110 may search a BOT on the basis of the translated physical address ADDR_p. For example, in the case that the translated physical address ADDR_p includes the physical block number of the eighth memory block BLK8, the memory controller 110 may search a BOT index corresponding to the eighth memory block BLK8 in the BOT. As illustrated in FIG. 12, the BOT index corresponding to the eighth memory block BLK8 may be "5". The BOT index "5" corresponding to the physical block number of BLK8 indicates that the eighth memory block BLK8 is a sixthly assigned block.

The memory controller 110 may generate or calculate a page serial number corresponding to the received physical address ADDR_p on the basis of the searched BOT index and the physical address ADDR_p. For example, the memory controller 110 may generate the page serial number on the basis of a mathematical formula 1.

$$PSN = \alpha X + \beta \quad \text{[mathematical formula 1]}$$

Referring to the mathematical formula 1, PSN indicates a page serial number, X indicates the searched BOT index, α indicates a constant value, and β indicates a page offset. The constant value α may be determined based on the number of pages included in one memory block or may be determined based on a loop count of the BOT. In an exemplary embodiment, the loop count of the BOT indicates the number of times that a physical block number is written up to a BOT index of "n". The page offset β indicates a location of a page in a memory block. For example, the page offset β may be determined based on the physical page number included in the physical address ADDR_p. For brevity of description, it will be assumed that a page serial number corresponding to the physical address ADDR_p is "109742".

On the basis of the method described with reference to FIG. 12, the memory controller 110 may generate or calculate the page serial number corresponding to the received logical address ADDR_1.

The operation method of the memory controller 110 described with reference to FIG. 12 may be performed in a hardware or software layer. For example, the operation method of the memory controller 110 described with reference to FIG. 12 may be performed by the FTL 113 or the CPU 114 driving the FTL 113. The memory controller 110 may include a separate hardware performing the operation method of the memory controller 110 described with reference to FIG. 12.

Figure 13:
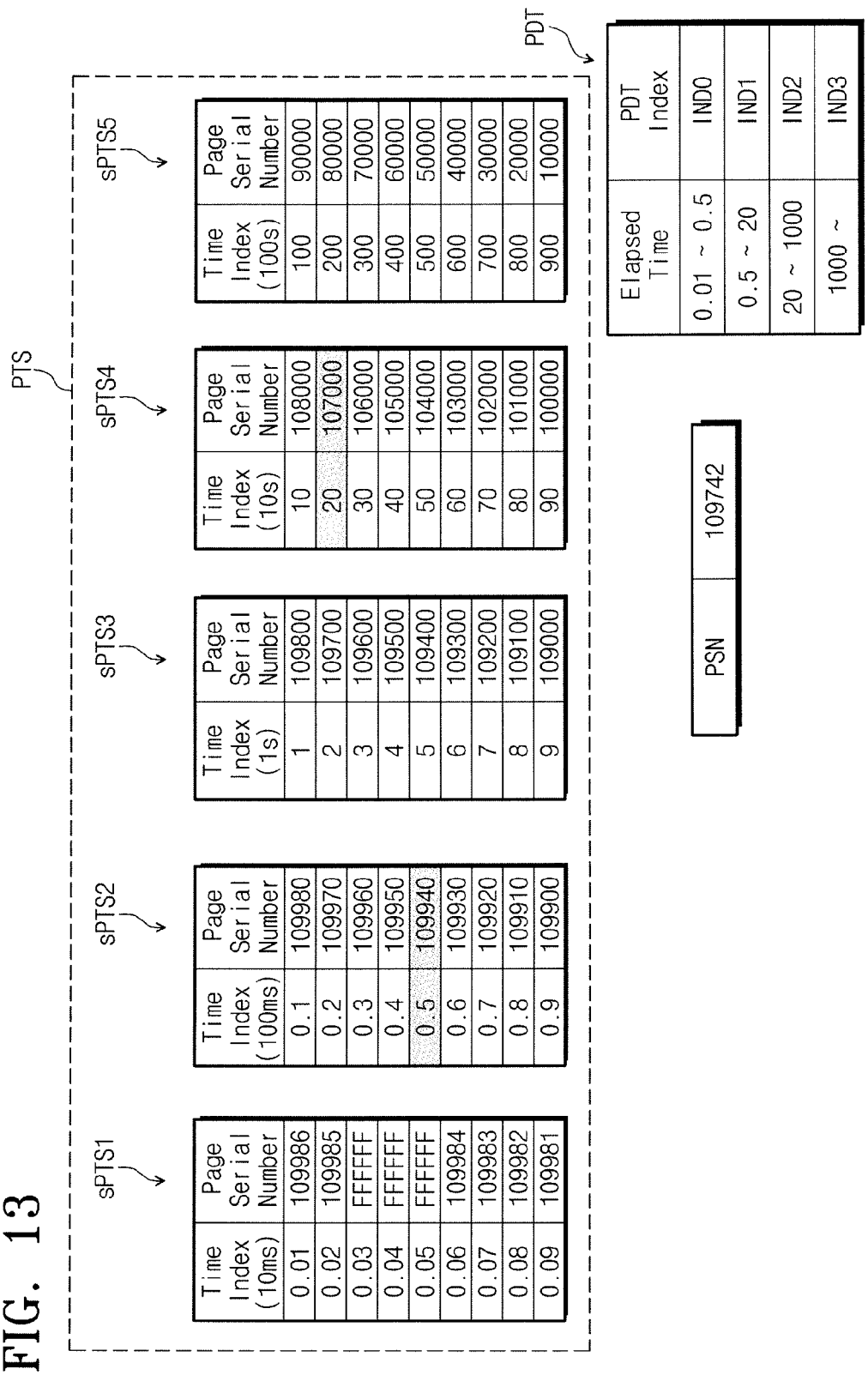
FIG. 13 is a drawing for explaining a step S140 of FIG. 11 in accordance with an exemplary embodiment of the present inventive concept.

FIG. 13 is a drawing for explaining a step S140 of FIG. 11 in accordance with an exemplary embodiment of the present inventive concept. For brevity of description, it will be assumed that a page serial number corresponding to the received logical address ADDR_1 is "109742". It will be assumed that elapsed time periods of the PDT are a period between 0.01 s and 0.5 s, a period between 0.5 s and 20 s, a period between 20 s and 100 s, and a period greater than 1000 s. However, the present inventive concept is not limited thereto.

The memory controller 110 may generate a page serial number on the basis of the method described with reference to FIG. 12. The memory controller 110 may determine a PDT index on the basis of the PDT and the PTS.

The memory controller 110 may select some of the page serial numbers included in the PTS on the basis of the elapsed time periods of the PDT. For example, in the case that the elapsed time periods of the PDT are a period between 0.01 s and 0.5 s, a period between 0.5 s and 20 s, a period between 20 s and 100 s, and a period greater than 1000 s, the memory controller 110 may select page serial numbers having 0.5 s and 20 s in the PTS, respectively. As described in FIG. 13, the page serial numbers selected by the memory controller 110 may be "109940" and "107000", for example, which may correspond to time indices of 0.5 s and 20 s, respectively.

The memory controller 110 may compare the selected page serial numbers with the generated page serial number. For example, the memory controller 110 may compare the selected page serial numbers (e.g., "107000" and "109940") with the generated page serial number (e.g., "109742") to judge which period among the periods described above (e.g., the period between 0.01 s and 0.5 s, the period between 0.5 s and 20 s, the period between 20 s and 100 s, and the period greater than 1000 s) includes the generated page serial number (e.g., "109742"). Since the generated page serial number is "109742", it may be included in a period between the page serial numbers of "107000" and the page serial numbers of "109940". For example, a program elapsed time of a page corresponding to the generated page serial number (e.g., "109742") is included in a period between 0.5 s~20 s. In this case, the memory controller 110 may select a first PDT index IND1.

As described above, to search a time index of the generated page serial number, the memory controller 110 may select some of the page serial numbers included in the PTS on the basis of the elapsed time periods of the PDT without searching the whole PTS and compare some of the selected page serial numbers with the generated page serial number to determine a PDT index. For example, the memory controller 110 sequentially compares whether the generated page serial number is greater than the selected page serial numbers and judges whether the generated page serial number is included in a period in which a comparison result is changed. Thus, performance of the memory controller 110 is increased.

Figure 14:
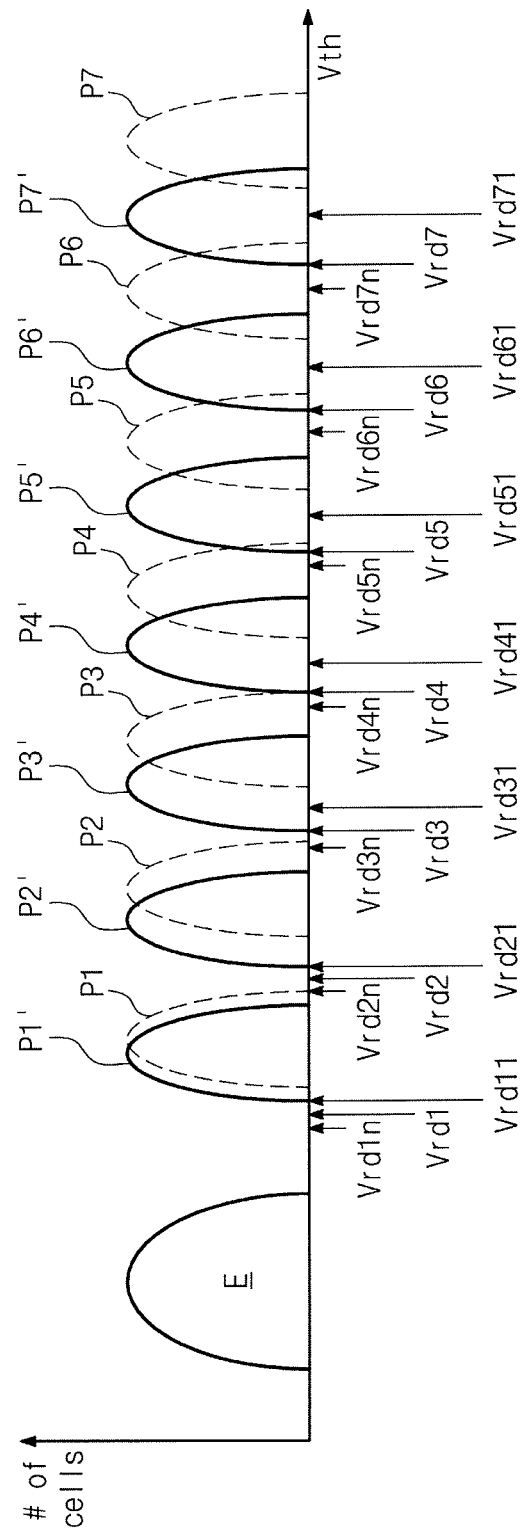

FIGS. 14 and 15 are drawings for explaining a step S150 of FIG. 11 in accordance with an exemplary embodiment of the present inventive concept. Referring to FIGS. 11 and 14, as time elapses, threshold voltages of a plurality of memory cells included in the nonvolatile memory device 120 may be changed as illustrated in FIG. 14. For example, the nonvolatile memory device 120 may program the memory cells so that each of the memory cells have any one state of an erase state E and first through seventh program states P1~P7. In the case that each of the memory cells has any one state of an erase state E and first through seventh program states P1~P7, the nonvolatile memory device 120 may distinguish a program state of the memory cells using read voltages Vrd11~Vrd71.

However, as time elapses, the memory cells have any one state of the erase state E and program states P1'~P7'. For example, in the case that the nonvolatile memory device 120 performs a read operation on the memory cells using the read voltages Vrd11~Vrd71, a normal data (or, data including correctable errors) cannot be read out.

The memory controller 110 may determine levels of read voltages of the nonvolatile memory device 120 on the basis of the selected PDT index. For example, the nonvolatile memory device 120 may perform a read operation on the basis of first through seventh read voltages Vrd1~Vrd7. The memory controller 110 may control levels of the first through seventh read voltages Vrd1~Vrd7 on the basis of the selected PDT index. The first read voltage Vrd1 is included between the voltage Vrd11 and a voltage Vrd1n. The second read voltage Vrd2 is included between the voltage Vrd21 and a voltage Vrd2n. The third read voltage Vrd3 is included between the voltage Vrd31 and a voltage Vrd3n. The fourth read voltage Vrd4 is included between the voltage Vrd41 and a voltage Vrd4n. The fifth read voltage Vrd5 is included between the voltage Vrd51 and a voltage Vrd5n. The sixth read voltage Vrd6 is included between the voltage Vrd61 and a voltage Vrd6n. The seventh read voltage Vrd7 is included between the voltage Vrd71 and a voltage Vrd7n.

The memory controller 110 may determine a read voltage set of the nonvolatile memory device 120 on the basis of the selected PDT index. For example, as illustrated in FIG. 15, the PDT may further include information of a plurality of read voltage sets corresponding to a PDT index. The memory controller 110 may determine a read voltage set corresponding to the selected PDT index on the basis of the PDT. In the case that the selected PDT index is "IND1", the memory controller 110 may select a read voltage set V12~V72. The memory controller 110 may control the nonvolatile memory device 120 so that the nonvolatile memory device 120 performs a read operation on the basis of the selected read voltage set V12~V72.

According to an exemplary embodiment of the present inventive concept, the memory controller 110 may manage a program elapsed time of a plurality of pages on the basis of the PTS. At this time, the memory controller 110 manages the PTS in a log-scale using a page serial number indicating information on a write order for each page.

In a read operation, the memory controller 110 may select some of page serial numbers included in the PTS on the basis of a time period of the PDT, compare the selected page serial number with a page serial number of a page corresponding to the received logical address ADDR_1 to select a PDT index, and control levels of read voltages being used in the nonvolatile memory device 120 on the basis of the selected PDT index.

For example, when the memory controller 110 estimates a program elapsed time of a page corresponding to the received logical address ADDR_J on the basis of the PTS, it is not necessary to scan the whole page serial numbers of the PTS, and thus, a search speed may become high. Thus, a nonvolatile memory system having increased performance is provided.

Figure 16:
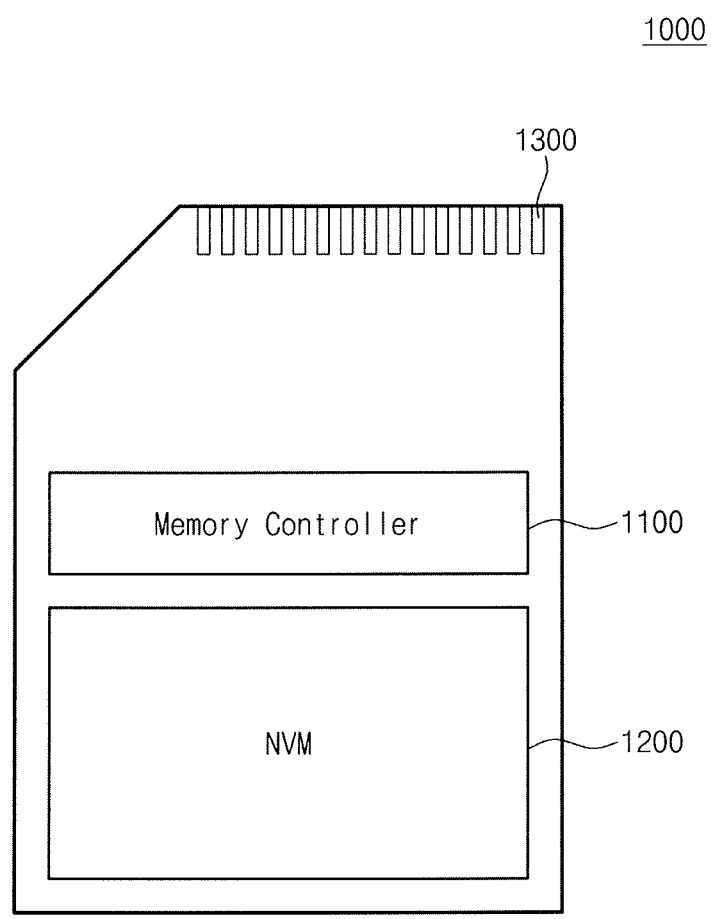
FIG. 16 is a block diagram illustrating a memory card system including a nonvolatile memory system in accordance with an exemplary embodiment of the present inventive concept.

FIG. 16 is a block diagram schematically illustrating a memory card system including a nonvolatile memory system according to an exemplary embodiment of the present inventive concept. Referring to FIG. 16, a memory card system 1000 contains a controller 1100, a nonvolatile memory 1200, and a connector 1300.

The controller 1100 is connected to the nonvolatile memory 1200. The controller 1100 is configured to access the nonvolatile memory 1200. For example, the controller 1100 may be adapted to control an overall operation of the nonvolatile memory 1200 including a read operation, a write operation, an erase operation, a background operation, and so on. The controller 1100 provides an interface between the nonvolatile memory 1200 and a host. The controller 1100 may be configured to drive a firmware for controlling the nonvolatile memory 1200.

In an exemplary embodiment, the controller 1100 may include components such as a RAM, a processing unit, a host interface, a memory interface, an error correction unit, and so on.

The controller 1100 may communicate with an external device according to a particular communication protocol. For example, the controller 1100 may communicate with the external device through at least one of various interface protocols such as a universal serial bus (USB) protocol, a multimedia card (MMC) protocol, an embedded MMC (eMMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a firewire protocol, an universal flash storage (UFS) protocol, and so on.

In an exemplary embodiment, the controller may be a memory controller 110 described with reference to FIGS. 1 through 15. The nonvolatile memory 1200 may be implemented with a variety of nonvolatile memory devices, such as an EPROM, a NAND flash memory, a NOR flash memory, a PRAM, an ReRAM, an FRAM, an Spin-Torque Magnetic RAM (STT-MRAM), and so on.

In an exemplary embodiment, the controller 1100 and the nonvolatile memory 1200 may be integrated in a single semiconductor device to form a solid state drive (SSD). The controller 1100 and the nonvolatile memory 1200 may be integrated in a single semiconductor device. For example, the controller 1100 and the nonvolatile memory 1200 may be integrated in a single semiconductor device to form a memory card such as a PC card (e.g., a personal computer memory card international association (PCMCIA)), a compact flash card (CF), a smart media card (e.g., SM, SMC), a memory stick, a multimedia card (e.g., MMC, RS-MMC, MMCmicro), an SD card (e.g., SD, miniSD, microSD, SDHC), a universal flash storage (UFS), and so on.

A nonvolatile memory 1200 and/or a memory card system 1000 according to an exemplary embodiment of the present inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and so on.

Figure 17:
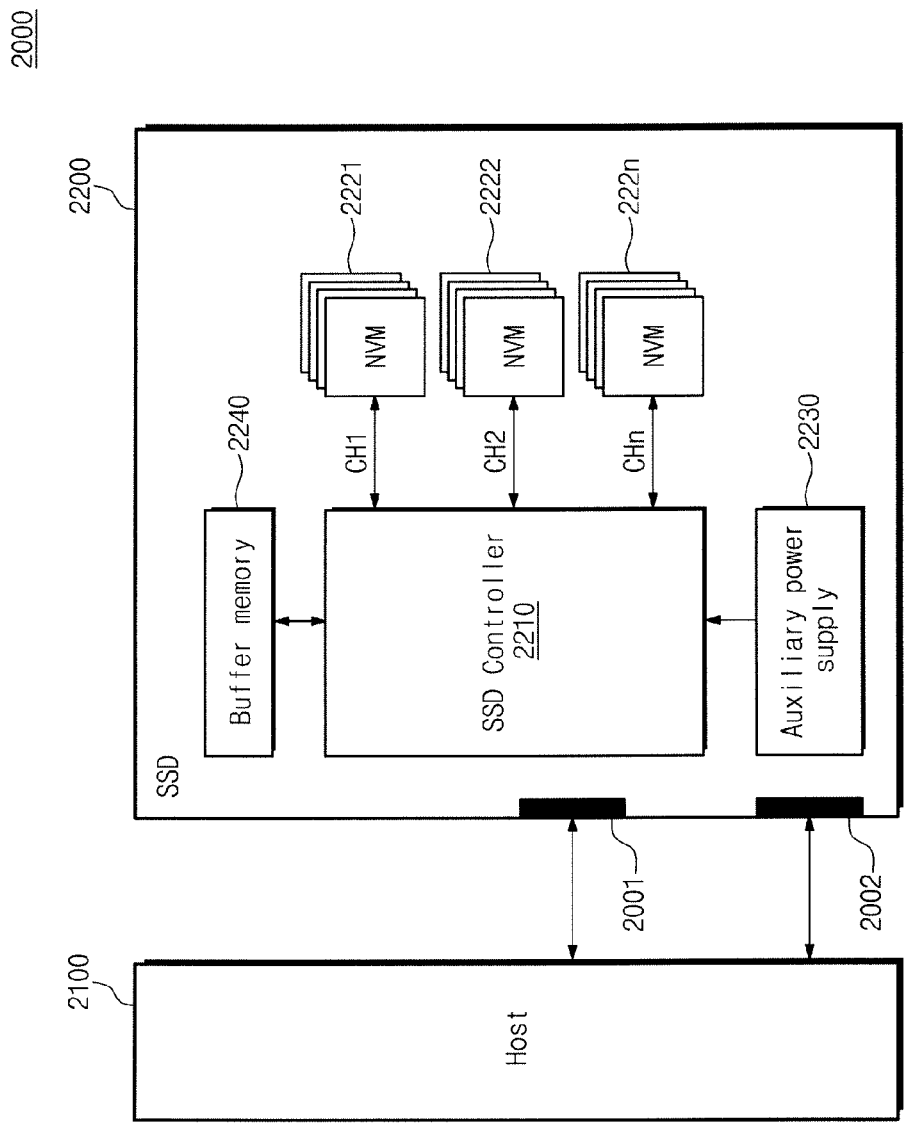
FIG. 17 is a block diagram illustrating a solid state drive (SSD) system including a nonvolatile memory system in accordance with an exemplary embodiment of the present inventive concept.

FIG. 17 is a block diagram illustrating a solid state drive including a nonvolatile memory system according to an exemplary embodiment of the present inventive concept. Referring to FIG. 17, a solid state drive (SSD) system 2000 comprises a host 2100 and an SSD 2200. The SSD 2200 exchanges signals SGL with the host 2100 through the host interface 2001 and is supplied with a power through a power connector 2002. The SSD 2200 comprises a plurality of nonvolatile memories 2221 to 222n, an SSD controller 2210, an auxiliary power supply 2230, and a buffer memory 2240.

The SSD controller 2210 controls the nonvolatile memories 2221 to 222n in response to a signal SIG from the host 2100. In an exemplary embodiment, the SSD controller 2210 may be the memory controller described with reference to FIGS. 1 through 15.

The auxiliary power supply 2230 is connected to the host 2100 via the power connector 2002. The auxiliary power supply 2230 is charged by a power PWR from the host 2100. When a power is not smoothly supplied from the host 2100, the auxiliary power supply 2230 powers the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 acts as a buffer memory of the SSD 2200. For example, the buffer memory 2240 temporarily stores data received from the host 2100 or from the nonvolatile memory devices 2221 to 222n as flash memories, or it temporarily stores metadata (e.g., mapping tables) of the flash memories 2221 to 222n. The buffer memory 2240 may include volatile memories such as a DRAM, an SDRAM, a double data rate SDRAM (DDR SDRAM), a low power double data rate SDRAM (LPDDR SDRAM), an SRAM, and so on, or nonvolatile memories such as an FRAM ReRAM, an STT-MRAM, a PRAM, and so on.

Figure 18:
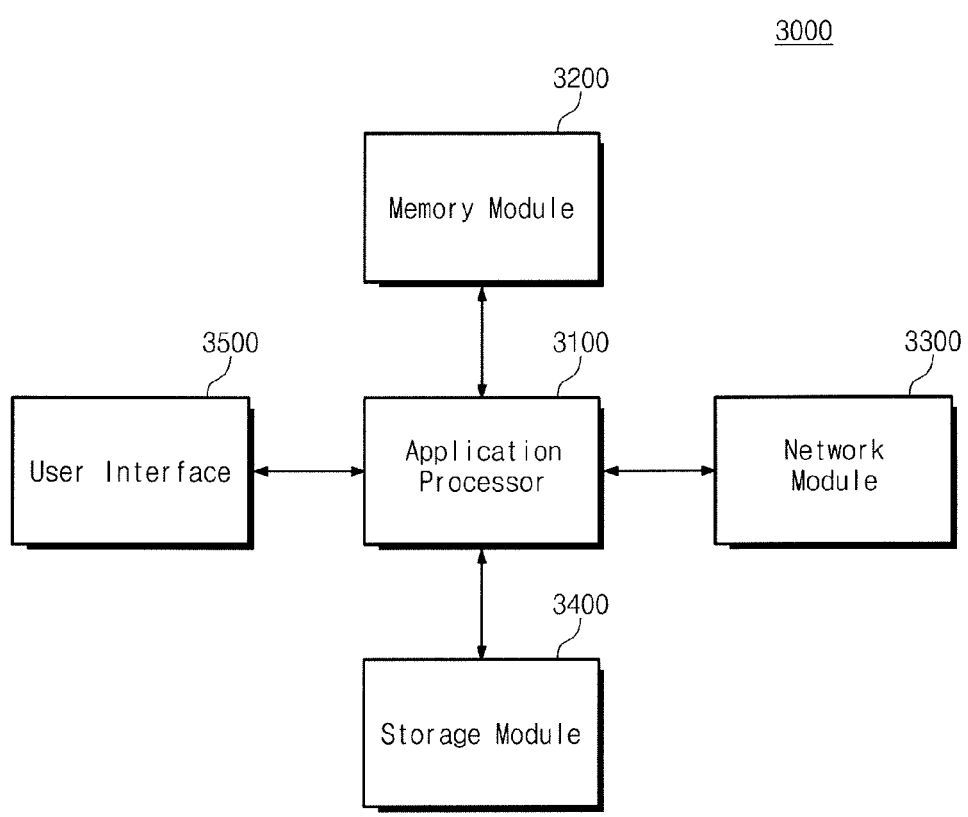
FIG. 18 is a block diagram illustrating a user system including a nonvolatile memory system in accordance with an exemplary embodiment of the present inventive concept.

FIG. 18 is a block diagram schematically illustrating a user system including a nonvolatile memory system according to an exemplary embodiment of the present inventive concept. Referring to FIG. 18, a user system 3000 includes an application processor 3100, a memory module 3200, a network module 3300, a storage module 3400, and an input interface 3500.

The application processor 3100 drives components of the user system 3000, an operating system, and so on. For example, the application processor 3100 may include controllers for controlling components of the user system 3000, graphics engines, a variety of interfaces, and so on. The application processor 3100 may be implemented with a system-on-chip (SoC).

The memory module 3200 operates as a main memory, a working memory, a buffer memory, or a cache memory of the user system 3000. The memory module 3200 may be implemented with a volatile random access memory, such as a DRAM, an SDRAM, a DDR SDRAM, a DDR2 SDRAM, a DDR3 SDRAM, an LPDDR DRAM, an LPDDR2 DRAM, or an LPDDR3 DRAM or a nonvolatile random access memory, such as a PRAM, an MRAM, an RRAM, or an FRAM. In an exemplary embodiment, the memory module 3200 may be packaged with the application processor 3100 based on packaging technologies such as Package on Package (POP), Multi Chip Package (MCP), and so on.

The network module 3300 communicates with external devices. For example, the network module 3300 may support wireless communications, such as Code Division Multiple Access (CDMA), Global System for Mobile communication (GSM), wideband CDMA (WCDMA), CDMA-2000, Time Division Multiple Access (TDMA), Long Term Evolution (LTE), Worldwide Interoperability for Microwave Access (WiMAX), Wireless Local Access Network (WLAN), Ultra-Wide Band (UWB), Bluetooth, Wireless Display (WI-DI), and so on. In an exemplary embodiment, the network module 3300 is included in the application processor 3100.

The storage module 3400 stores data. For example, the storage module 3400 stores data received from an external device. The storage module 3400 provides the application processor 3100 with data stored therein. For example, the storage module 3400 may be implemented with a semiconductor memory device such as a PRAM, an MRAM, an RRAM, a NAND flash memory, a NOR flash memory, a three-dimensional NAND flash memory, or the like.

In an exemplary embodiment, the storage module 3400 may be a nonvolatile memory system described with reference to FIGS. 1 to 15. The storage module 3400 may operate based on an operating method described with reference to FIGS. 1 to 15.

The input interface 3500 may provide interfaces for providing data or commands to the application processor 3100 or for outputting data to an external device. For example, the input interface 3500 may include user input interfaces, such as a key board, a key pad, a button, a touch panel, a touch screen, a touch pad, a touch ball, a camera, a microphone, a Gyroscope, a vibration sensor, a piezoelectric element, and so on. The input interface 3500 may include user output interfaces, such as a Liquid Crystal Display (LCD) device, an Organic Light Emitting Diode (OLED) display device, an Active Matrix OLED (AMOLED) display device, an LED, a speaker, a motor, and so on.

According to an exemplary embodiment of the present inventive concept, when the memory controller estimates or searches information on a program elapsed time for controlling levels of read voltages being used in a nonvolatile memory device, a searching time may be reduced. Thus, since a read latency is reduced, there are provided a nonvolatile memory system having increased performance and an operation method of a memory controller.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope of the present inventive concept is to be determined by the broadest permissible interpretation of the following claims and their equivalents, and shall not be limited by the foregoing detailed description.

What is claimed is:
1. A nonvolatile memory system comprising:
a nonvolatile memory device comprising a plurality of memory blocks each having a plurality of pages, wherein the nonvolatile memory device is configured to perform a read operation on the plurality of pages on the basis of a plurality of read voltages; and a memory controller configured to manage page serial numbers of some of the plurality of pages according to a program elapsed time of each of the plurality of pages, wherein the memory controller is configured to select at least one of the managed page serial numbers by using a plurality of elapsed time period stored in the memory controller, to compare the selected at least one of the page serial numbers with a page serial number of a page corresponding to the received logical address, and to control levels of the read voltages according to a result of the comparison when the memory controller receives a read request and a logical address from an external device.

2. The nonvolatile memory system of claim 1, wherein each of the page serial numbers indicates a program order of each of the plurality of pages.

3. The nonvolatile memory system of claim 1, wherein the memory controller is configured to manage the page serial numbers of some of the plurality of pages as a program time stamp table according to the program elapsed time of each of the plurality of pages.

4. The nonvolatile memory system of claim 3, wherein the program time stamp table comprises a plurality of sub tables,
wherein the memory controller is configured to periodically update the program time stamp table.

5. The nonvolatile memory system of claim 3, wherein the program time stamp table comprises a plurality of sub tables,
wherein each of the plurality of sub tables comprises the managed page serial numbers and information on the program elapsed time, and
wherein the information on the program elapsed time of each of the plurality of sub tables have different periods from each other.

6. The nonvolatile memory system of claim 5, wherein the memory controller is configured to update each of the sub tables at different periods from each other.

7. The nonvolatile memory system of claim 1, wherein the memory controller is configured to manage an assignment order of the plurality of memory blocks.

8. The nonvolatile memory system of claim 7, wherein the memory controller is configured to generate a page serial number of each of the plurality of pages on the basis of the assignment order.

9. The nonvolatile memory system of claim 7, wherein the page serial numbers are sequentially increased according to a program order of each of the plurality of pages.

10. The nonvolatile memory system of claim 1, wherein the memory controller is configured to select the at least one of the managed page serial numbers on the basis of a predefined table,
wherein the predefined table comprises the plurality of elapsed time periods corresponding to the program elapsed time and index information corresponding to the levels of the read voltages.

11. The nonvolatile memory system of claim 10, wherein the memory controller is configured to compare whether the selected at least one of the page serial numbers are greater than the page serial number of the page corresponding to the received logical address, and to determine a first elapsed time period of the elapsed time periods based on the result of the comparison.

12. The nonvolatile memory system of claim 11, wherein the memory controller is configured to control the levels of the read voltages levels of read voltages corresponding to the determined first elapsed time period.

13. The nonvolatile memory system of claim 1, wherein the nonvolatile memory device is configured to perform the read operation on the page corresponding to the received logical address on the basis of the controlled read voltages.

14. An operation method of a memory controller for controlling a nonvolatile memory device that includes a plurality of pages, comprising:
receiving a read command and a logical address from an external device;
generating a page serial number corresponding to the received logical address;
selecting at least one of first page serial numbers being managed, among page serial numbers of the plurality of pages, according to a program elapsed time of each of the plurality of pages on the basis of elapsed time periods of a predefined table;
comparing the selected page serial numbers with the page serial number corresponding to the received logical address; and
controlling levels of read voltages of the nonvolatile memory device on the basis of a result of the comparison.

15. The operation method of claim 14, wherein the comparing the selected at least one of first page serial numbers with the page serial number corresponding to the received logical address comprises:
sequentially comparing whether each of the selected at least one of first page serial numbers is greater than the page serial number corresponding to the received logical address; and
determining a first elapsed time period, of the elapsed time periods, corresponding to the generated page serial number on the basis of the result of the comparison.

16. The operation method of claim 15, wherein the controlling the levels of the read voltages of the nonvolatile memory device on the basis of the result of the comparison comprises controlling the levels of the read voltages to levels of read voltages corresponding to the determined first elapsed time period.

17. A nonvolatile memory system comprising:
a nonvolatile memory device comprising a plurality of memory blocks each including a plurality of pages, wherein the nonvolatile memory device is configured to perform a read operation on the plurality of pages on the basis of a plurality of read voltages; and
a memory controller comprising a random access memory (RAM) storing a block order table (BOT), a program time stamp table (PTS), and a predefined table (PDT), wherein the memory controller is configured to manage the block order table according to an assignment order of the plurality of memory blocks, to store page serial numbers of some of the plurality of pages in the program time stamp table according to a program elapsed time of each of the plurality of pages, and to manage the stored page serial numbers,
wherein in the case that the memory controller receives a read command and a logical address from an external device, the memory controller is configured to generate a first page serial number of a page corresponding to the received logical address on the basis of the block order table in response to the read command, to select at least one of the page serial numbers stored in the program time stamp table on the basis of the predefined table, to compare the selected page serial numbers with the generated first page serial number, and to control levels of the read voltages according to a result of the comparison, wherein the predefined table comprises an elapsed time period, and wherein the memory controller is configured to select the at least one of the page serial numbers stored in the program time stamp table on the basis of the elapsed time period.

18. The nonvolatile memory system of claim 17, wherein the memory controller is configured to translate the received logical address into a physical address including a physical block number and a physical page number.

19. The nonvolatile memory system of claim 17, wherein the nonvolatile memory device performs a read operation on the basis of the controlled read voltages.

* * * * *